(12) United States Patent
Savant et al.

(10) Patent No.: US 12,315,730 B2
(45) Date of Patent: May 27, 2025

(54) SEMICONDUCTOR DEVICES WITH METAL INTERCALATED HIGH-K CAPPING

(71) Applicant: Taiwan Semiconductor Manufacturing Company, Ltd., Hsinchu (TW)

(72) Inventors: Chandrashekhar Prakash Savant, Hsinchu (TW); Kin Shun Chong, Hsinchu (TW); Tien-Wei Yu, Hsinchu (TW); Chia-Ming Tsai, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 418 days.

(21) Appl. No.: 17/741,270

(22) Filed: May 10, 2022

(65) Prior Publication Data

US 2023/0162983 A1 May 25, 2023

Related U.S. Application Data

(60) Provisional application No. 63/283,092, filed on Nov. 24, 2021.

(51) Int. Cl.
*H01L 21/28* (2025.01)
*H10D 64/66* (2025.01)

(52) U.S. Cl.
CPC ..... *H01L 21/28088* (2013.01); *H10D 64/667* (2025.01)

(58) Field of Classification Search
CPC ............... H10D 64/01; H10D 30/6735; H10D 30/6757; H10D 64/667; H10D 64/691;
(Continued)

(56) References Cited

U.S. PATENT DOCUMENTS 8,890,264 B2 * 11/2014 Dewey ................ H10D 30/021
257/330
9,960,160 B2 * 5/2018 Lin ........................ H10D 84/85
(Continued)

OTHER PUBLICATIONS

Pao et al., "Gate-All-Around Semiconductor Device and Method," U.S. Appl. No. 17/387,636, filed Jul. 28, 2021, Assignee: Taiwan Semiconductor Manufacturing Company, Inc., 27 pages specification, 33 pages drawings.

*Primary Examiner* — Caleb E Henry
(74) *Attorney, Agent, or Firm* — HAYNES AND BOONE, LLP

(57) ABSTRACT

A method includes providing a structure having a substrate, a semiconductor channel layer over the substrate, an interfacial oxide layer over the semiconductor channel layer, and a high-k gate dielectric layer over the interfacial oxide layer, wherein the semiconductor channel layer includes germanium. The method further includes forming a metal nitride layer over the high-k gate dielectric layer and performing a first treatment to the structure using a metal-containing gas. After the performing of the first treatment, the method further includes depositing a silicon layer over the metal nitride layer; and then annealing the structure such that a metal intermixing layer is formed over the high-k gate dielectric layer. The metal intermixing layer includes a metal oxide having metal species from the high-k gate dielectric layer and additional metal species from the metal-containing gas.

20 Claims, 14 Drawing Sheets

(58) Field of Classification Search
CPC ............ H10D 64/117; H10D 84/0188; H10D 84/201; H10D 8/40; H10D 30/686; H10D 64/252; H01L 21/28088; H01L 21/32053; H01L 21/2807; H01L 21/28264; H01L 21/28185; H01L 21/28202; H01L 21/28255; H02K 15/027; A61K 40/4218; B82Y 10/00; H10H 20/826; H10H 20/0165; B65D 83/767; A23B 2/783; H10F 55/20; H10F 99/00; F27D 17/20

See application file for complete search history.

(56) References Cited

U.S. PATENT DOCUMENTS

| | | | | |
|---|---|---|---|---|
| 11,171,134 | B2* | 11/2021 | Yu | H10D 64/683 |
| 2011/0049642 | A1* | 3/2011 | Scheiper | H10D 84/038 |
| | | | | 257/E27.06 |
| 2011/0127616 | A1* | 6/2011 | Hoentschel | H01L 21/823857 |
| | | | | 257/E21.409 |
| 2015/0132937 | A1* | 5/2015 | Kim | H01L 29/6659 |
| | | | | 438/590 |
| 2015/0287649 | A1* | 10/2015 | Ando | H01L 29/66545 |
| | | | | 257/369 |
| 2018/0145149 | A1* | 5/2018 | Chiang | H10D 64/691 |
| 2019/0019874 | A1* | 1/2019 | Ma | H01L 21/28518 |
| 2019/0096669 | A1 | 3/2019 | Bi et al. | |
| 2020/0105532 | A1* | 4/2020 | Liao | H01L 21/28185 |
| 2020/0119164 | A1* | 4/2020 | Tsau | H01L 29/78696 |
| 2020/0135879 | A1* | 4/2020 | Cheng | H01L 21/823842 |
| 2020/0135915 | A1 | 4/2020 | Savant et al. | |
| 2021/0074593 | A1 | 3/2021 | Savant et al. | |
| 2021/0134974 | A1* | 5/2021 | More | H10D 62/832 |
| 2021/0265481 | A1 | 8/2021 | Huang et al. | |
| 2021/0273103 | A1 | 9/2021 | Chen et al. | |
| 2021/0305381 | A1 | 9/2021 | Chiang et al. | |
| 2021/0336033 | A1 | 10/2021 | Huang et al. | |
| 2021/0359091 | A1 | 11/2021 | Hsu et al. | |
| 2021/0366783 | A1 | 11/2021 | Chu et al. | |
| 2021/0399104 | A1 | 12/2021 | Chang et al. | |
| 2022/0084830 | A1 | 3/2022 | Hsu et al. | |
| 2022/0093472 | A1 | 3/2022 | Hsu et al. | |
| 2022/0102221 | A1* | 3/2022 | Hsu | H10D 30/62 |
| 2022/0181463 | A1* | 6/2022 | More | H01L 21/82345 |
| 2022/0223693 | A1* | 7/2022 | Tung | H01L 29/66795 |
| 2023/0104442 | A1* | 4/2023 | Tung | H10D 30/6735 |
| | | | | 257/410 |
| 2024/0313067 | A1* | 9/2024 | Tung | B82Y 10/00 |

\* cited by examiner

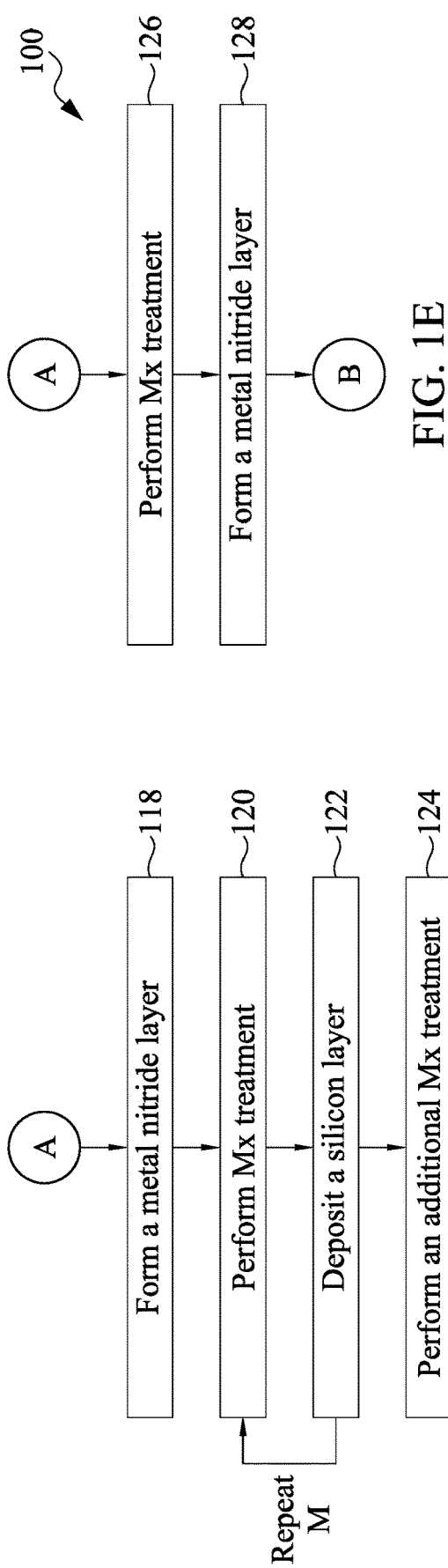
FIG. 1D
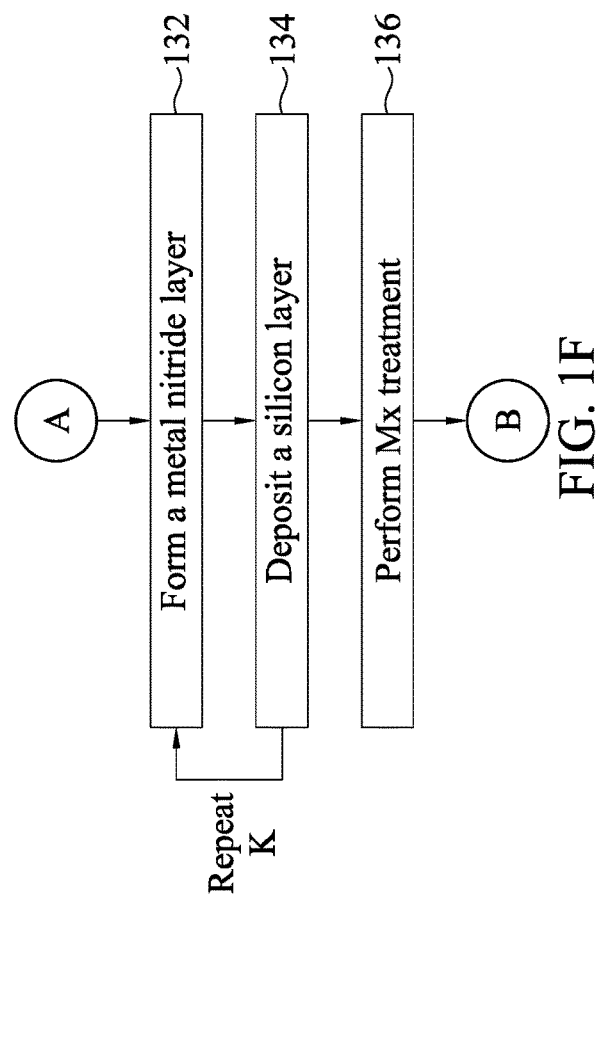
FIG. 1E
FIG. 1F

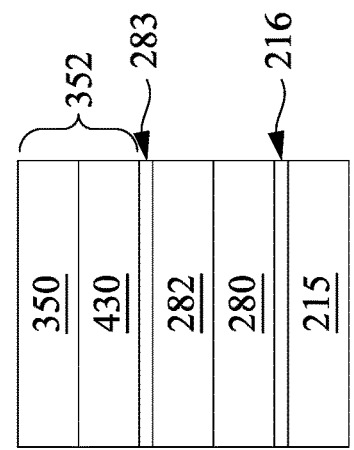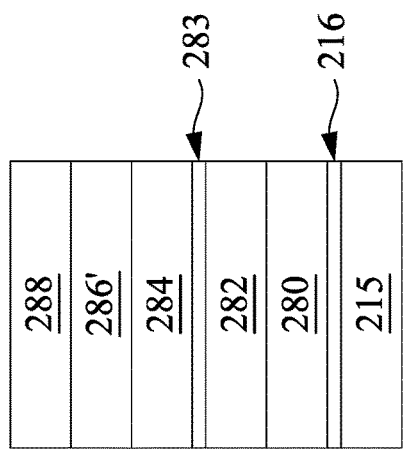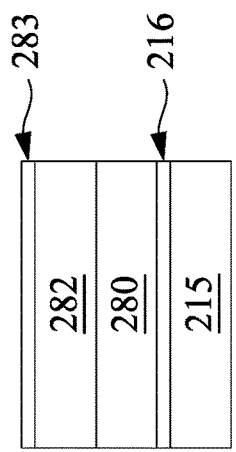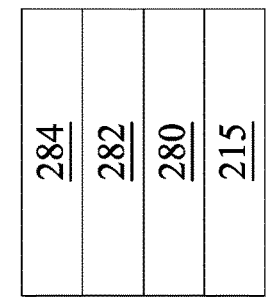
FIG. 3A FIG. 3B FIG. 3C FIG. 3D FIG. 3E FIG. 3F FIG. 3G FIG. 3H

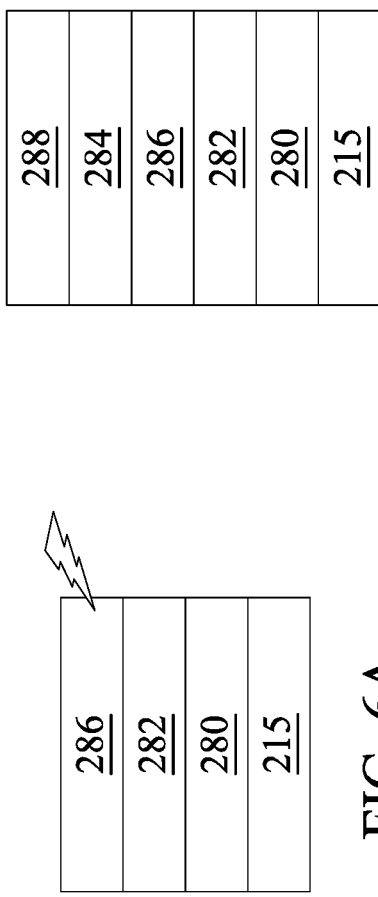
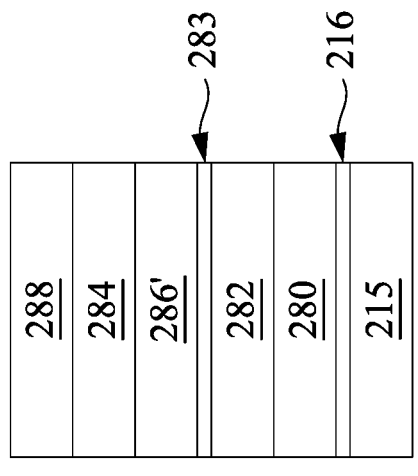

SEMICONDUCTOR DEVICES WITH METAL INTERCALATED HIGH-K CAPPING

PRIORITY

This application claims benefits from and priority to U.S. Provisional Application No. 63/283,092, filed Nov. 24, 2021, herein incorporated by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

One area of advances is how to form high quality gate dielectric layer(s) in advanced process nodes for various transistors, such as FinFET, gate-all-around (GAA) transistors including nanowire transistors and nanosheet transistors, and other types of multi-gate transistors. One reason is that the gate dielectric layer in such transistors is very thin and any defects in the gate dielectric layer may adversely affect the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, 1D, 1E, 1F, 1G, and 1H are flow charts of a method, in various embodiments, for fabricating a semiconductor device according to various aspects of the present disclosure.

FIGS. 3A, 3B, 3C, 3D, 3E, 3F, 3G, and 3H are diagrammatic cross-sectional views of the semiconductor device in FIG. 2A, in portion, at various fabrication stages (such as those associated with the method in FIGS. 1A, 1B, and 1H) according to various aspects of the present disclosure.

FIGS. 6A, 6B, 6C, and 6D are diagrammatic cross-sectional views of the semiconductor device in FIG. 2A, in portion, at various fabrication stages (such as those associated with the method in FIGS. 1A, 1E, and 1H) according to various aspects of the present disclosure.

DETAILED DESCRIPTION

Figure 1A:
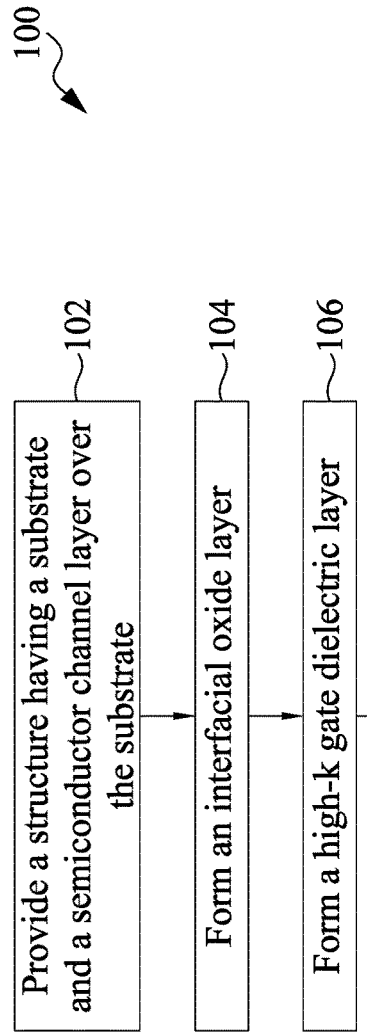
Figure 1C:
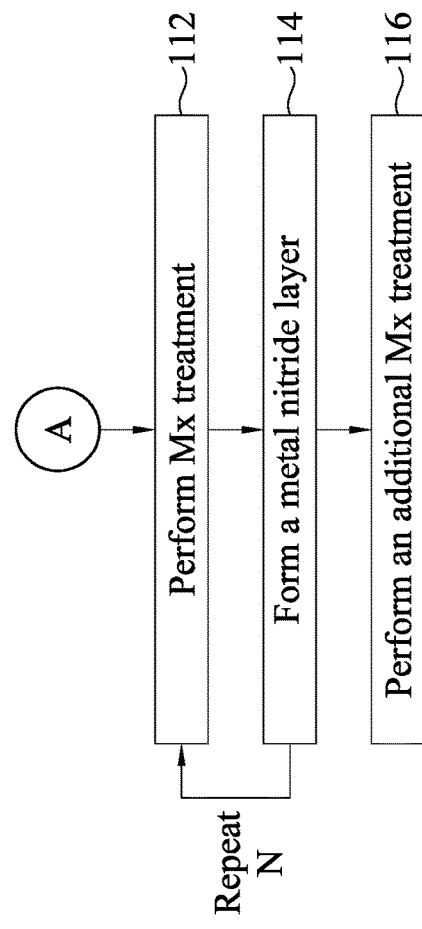

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure relates generally to integrated circuit (IC) devices, and more particularly, to IC devices having p-type MOSFETs (metal-oxide-semiconductor field effect transistors) or having both p-type and n-type MOSFETs. In certain embodiments, the p-type MOSFETs include germanium (such as silicon germanium alloy or germanium tin alloy) in their channel layer. When forming interfacial oxide layer(s) on such channel layer, germanium oxide may also form. Germanium oxide is unstable and may cause defects in the p-type MOSFETs. In an embodiment of the present disclosure, after one or more high-k gate dielectric layers are deposited on the interfacial oxide layer, a metal nitride layer, a metal layer, and a passivation layer are deposited. Then, a controlled treatment (such as rapid thermal annealing) is performed. The controlled treatment produces a metal intermixing layer between the high-k gate dielectric layers and the metal nitride layer by attracting oxygen from germanium oxide in the interfacial oxide layer. As a result, the content of germanium oxide in the interfacial oxide layer is reduced and the quality of the MOSFETs is improved. Afterwards, the passivation layer and the metal nitride layer are removed, and a metal gate electrode is formed over the metal intermixing layer. Advantageously, the present disclosure can be used to enhance the quality of the interfacial oxide layer and high-k gate dielectric layers. The present disclosure can be applied to multi-gate devices, such as FinFET and gate-all-around (GAA) devices, as well as planar devices.

FIGS. 1A-1H show flow charts of a method 100, in various embodiments, for fabricating a semiconductor device according to various aspects of the present disclosure. FIG. 2A is a diagrammatic top view of a semiconductor device 200, in portion, at a fabrication stage associated with method 100 in FIG. 1A according to various aspects of the present disclosure. FIGS. 2B-10B are diagrammatic cross-sectional views of the device 200, in portion, at various fabrication stage associated with method 100 in FIGS. 1A-1H according to various aspects of the present disclosure.

The device 200 is a multi-gate (or multigate) device in the present embodiments, and may be included in a microprocessor, a memory, and/or other IC device. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multi-gate device 200 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 2A-10B have been simplified for the sake of clarity to better understand the inventive concepts of the present disclosure. Additional features can be added in the device 200, and some of the features described below can be replaced, modified, or eliminated in other embodiments of the device 200. The fabrication of the device 200 is described below in conjunction with embodiments of the method 100.

The first embodiment of the present disclosure is described below by referring to FIGS. 1A, 1B, 1H, 2A-2E, 3A-3F, and 9A-10B. The method 100 (FIG. 1A) provides an initial structure of the device 200 at the operation 102, a portion of which is shown in FIGS. 2A-2C. The device 200 includes an active region 204 and a gate region 206 generally perpendicular to the active region 204. The active region 204 includes a pair of source/drain regions 204s and a channel region 204c between the pair of source/drain regions 204s. The gate region 206 engages the channel region 204c.

FIGS. 2B and 2C illustrate cross-sectional views of the device 200 along the A1-A1 and A2-A2 lines of FIG. 2A, respectively, according to an embodiment. The embodiment illustrated in FIGS. 2B and 2C is a nanowire FET, where its channel layers 215 are in the shape of nanowires. In an alternative embodiment, the device 200 can be a nanosheet FET where its channel layers 215 are in the shape of nanosheets. Both nanowire FET and nanosheet FET are GAA (gate-all-around) transistors. The device 200 may be of other types of GAA transistors in alternative embodiments.

Figure 2A:
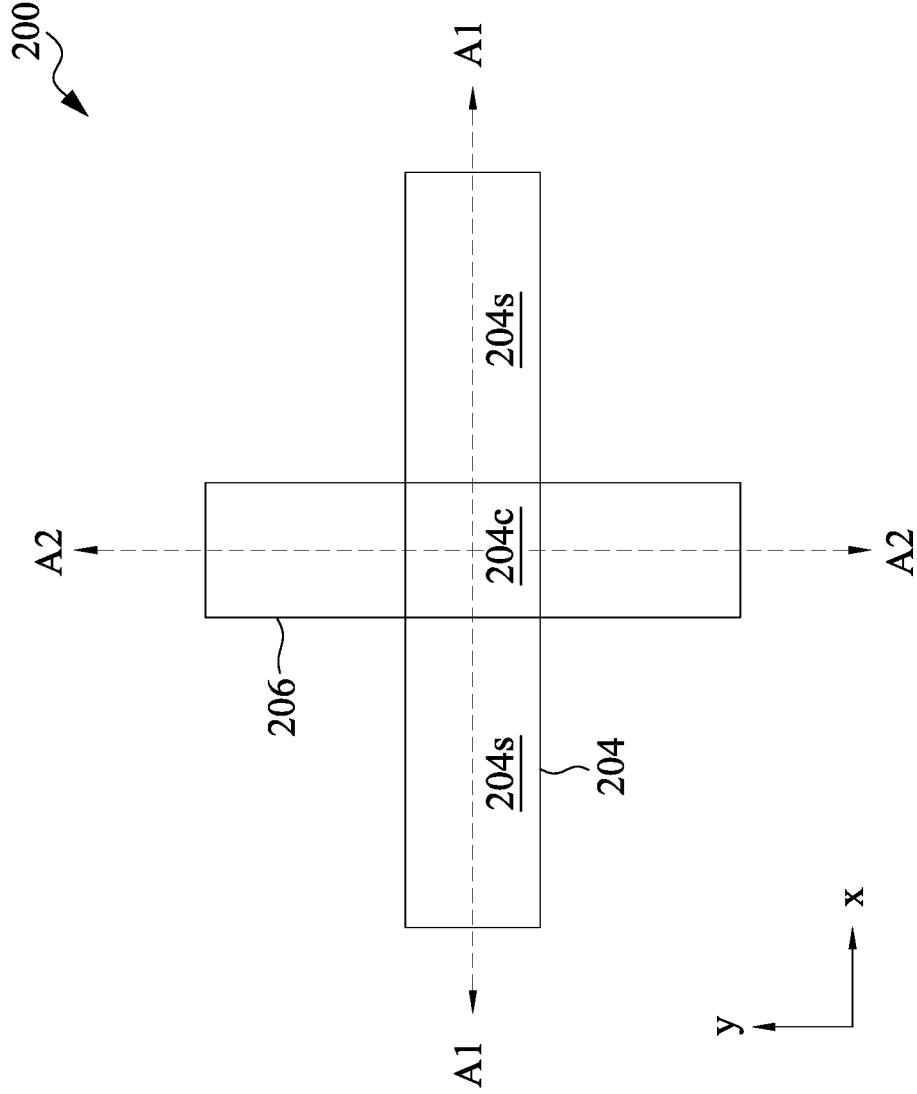
FIG. 2A is a diagrammatic top view of a semiconductor device, in portion, according to various aspects of the present disclosure.
Figures 2B, 2C:
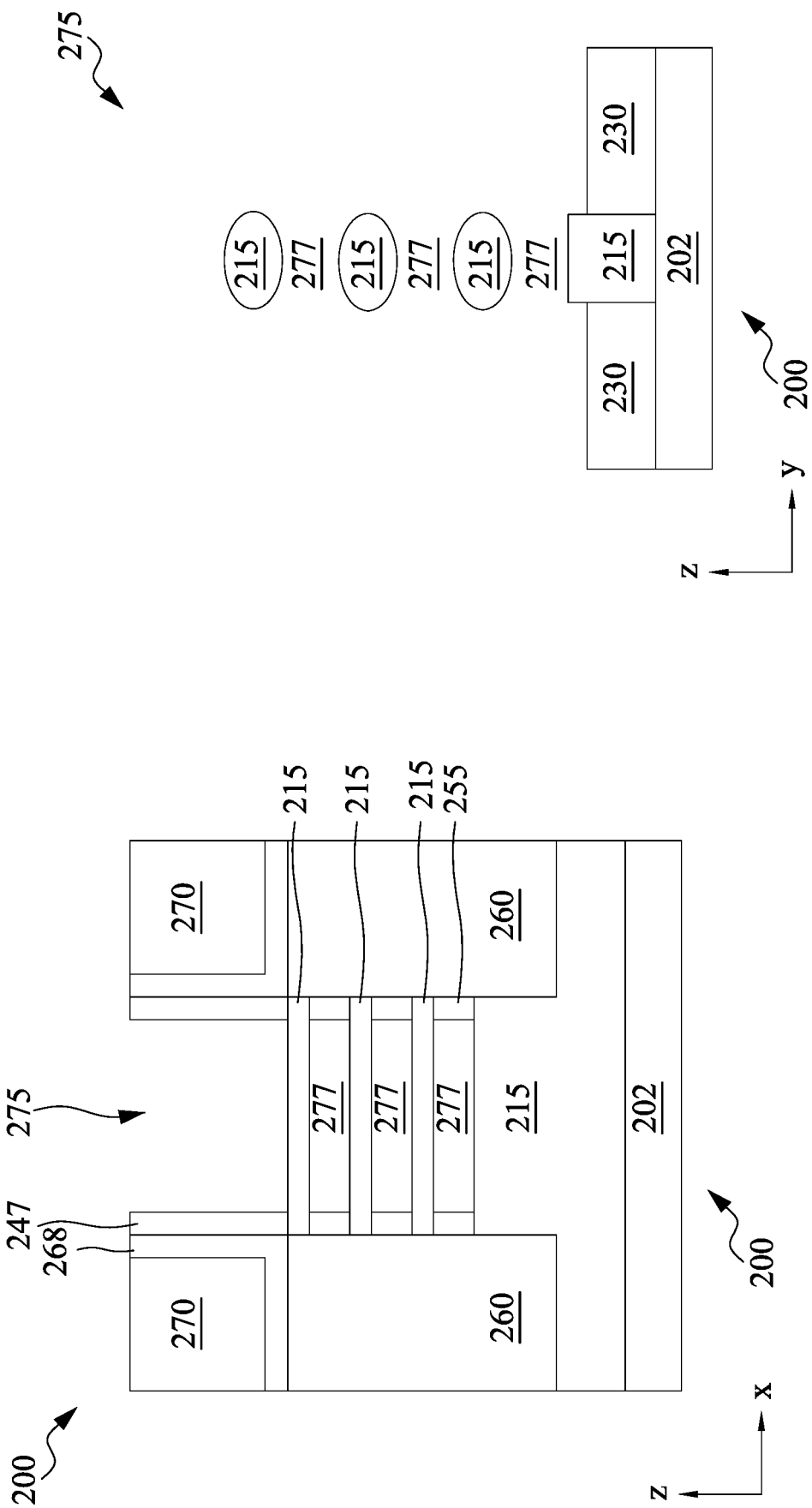
FIGS. 2B and 2C are diagrammatic cross-sectional views of the semiconductor device in FIG. 2A, in portion, according to an embodiment of the present disclosure.
Figure 2E:
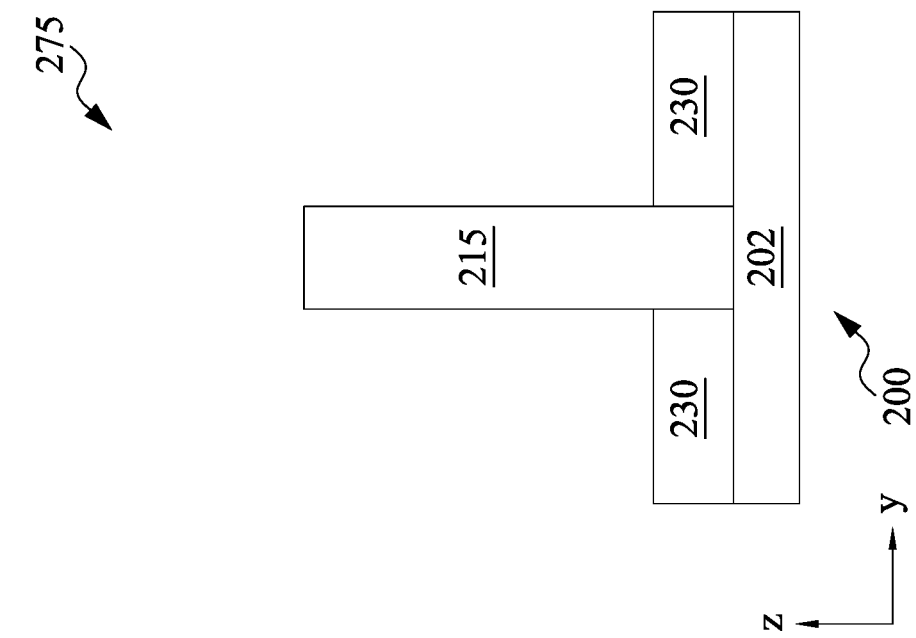
FIGS. 2D and 2E are diagrammatic cross-sectional views of the semiconductor device in FIG. 2A, in portion, according to another embodiment of the present disclosure.
Figure 2D:
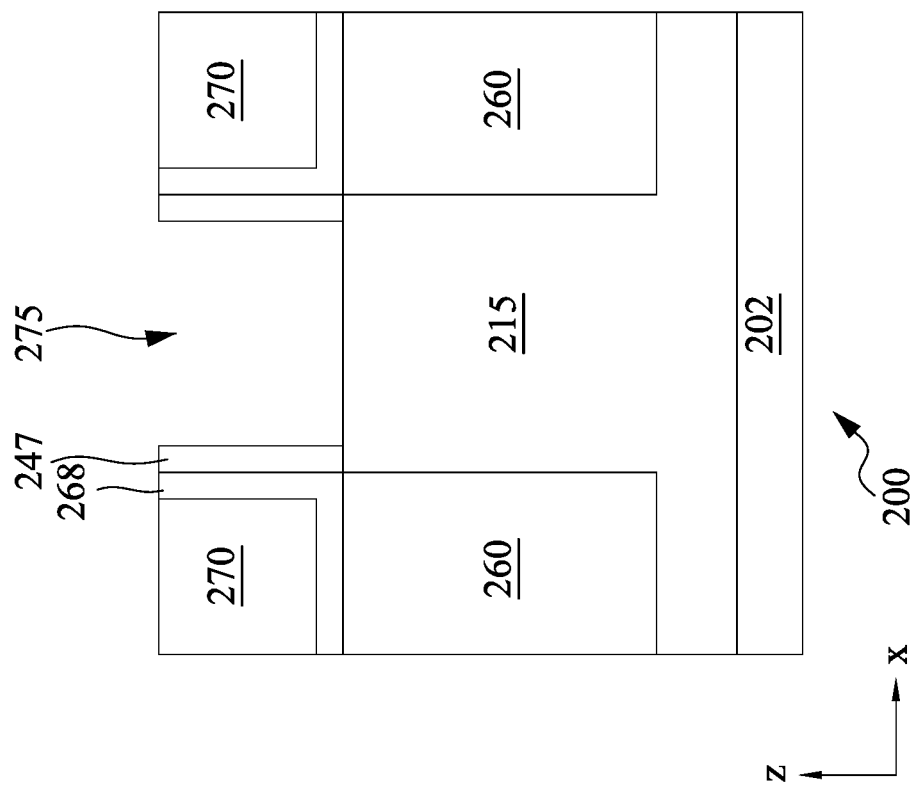

FIGS. 2D and 2E illustrate cross-sectional views of the device 200 along the A1-A1 and A2-A2 lines of FIG. 2A, respectively, according to another embodiment. In the embodiment depicted in FIGS. 2D and 2E, the channel layer 215 is in the shape of a fin rather than multiple stacked layers. Thus, it is also referred to as a fin 215 and the device 200 is a FinFET. The fin 215 extends from a substrate 202 and through an isolation feature 230. The fin 215 connects a pair of source/drain features 260. The fin 215 may have a height (along the "z" direction) about 40 nm to about 70 nm and a width (along the "y" direction) about 4 nm to about 8 nm in some embodiments. In the following description, the method 100 can be applied to either embodiments (GAA transistor or FinFET) shown in FIGS. 2B-2E, or to other types of transistors not illustrated in FIGS. 2B-2E.

Referring to FIGS. 2B-2E, the device 200 includes a substrate 202. The substrate 202 may include silicon (e.g., a silicon wafer). Alternatively or additionally, substrate 202 includes another semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), germanium tin (GeSn), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate.

The device 200 further includes a pair of source/drain features 260. For n-type transistor, the source/drain features 260 are n-type doped. For p-type transistor, the source/drain features 260 are p-type doped. In an embodiment, the device 200 is a p-type transistor (e.g., PMOSFET) and the source/drain features 260 are p-type doped. The source/drain features 260 may be formed by epitaxially growing semiconductor material(s) (e.g., Si, SiGe) to fill trenches in the device 200, for example, using CVD deposition techniques (e.g., Vapor Phase Epitaxy), molecular beam epitaxy, other suitable epitaxial growth processes, or combinations thereof. The source/drain features 260 are doped with proper n-type dopants and/or p-type dopants. For example, for n-type transistors, the source/drain features 260 may include silicon and be doped with carbon, phosphorous, arsenic, other n-type dopant, or combinations thereof; and for p-type transistors, the source/drain features 260 may include germanium, silicon germanium, or germanium tin, and be doped with boron, other p-type dopant, or combinations thereof.

Referring to FIGS. 2B-2C, the device 200 further includes a stack of semiconductor layers 215 suspended over the substrate 202 and connecting the pair of the source/drain features 260. The stack of semiconductor layers 215 serve as the transistor channels for the device 200. Accordingly, the semiconductor layers 215 are also referred to as semiconductor channel layers 215 or simply, channel layers 215. The channel layers 215 are exposed in a gate trench 275 which is resulted from the removal of a dummy gate from the gate region 206. The channel layers 215 may include single crystalline silicon. Alternatively, the channel layers 215 may comprise germanium, silicon germanium, germanium tin, or another suitable semiconductor material(s). Initially, the channel layers 215 are formed as part of a semiconductor layer stack that includes the channel layers 215 and other semiconductor layers of a different material. The semiconductor layer stack is patterned into a shape of a fin protruding above the substrate 202 using one or more photolithography processes, including double-patterning or multi-patterning processes. After the gate trench 275 is formed, the semiconductor layer stack is selectively etched to remove the other semiconductor layers, leaving the channel layers 215 suspended over the substrate 202 and between the respective source/drain features 260. The channel layers 215 are separated from each other and from the substrate 202 by gaps 277.

In some embodiments, each channel layer 215 has nanometer-sized dimensions. For example, each channel layer 215 may have a length (along the "x" direction) about 10 nm to about 300 nm, and a width (along the "y" direction) about 10 nm to about 80 nm, and a height (along the "z" direction) about 5 nm to about 30 nm in some embodiments. The vertical spacing (along the "z" direction) between the channel layers 215 may be about 5 nm to about 30 nm in some embodiments. Thus, the channel layer 215 can be referred to as a "nanowire," which generally refers to a channel layer suspended in a manner that will allow a metal gate electrode to surround the channel layer. In some embodiments, the channel layers 215 may be cylindrical-shaped (e.g., nanowire), rectangular-shaped (e.g., nanobar), sheet-shaped (e.g., nanosheet), etc., or have other suitable shapes. As discussed above, the channel layer 215 in the embodiment depicted in FIGS. 2D and 2E is in the shape of a fin rather than multiple stacked layers.

The device 200 further includes isolation feature(s) 230 to isolate the active region 204 from other active regions. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. Isolation features 230 can include multiple layers of insulating materials.

The device 200 further includes gate spacers 247 adjacent to the source/drain features 260. The gate spacers 247 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacers 247 include a multi-layer structure, such as a first dielectric layer that includes silicon nitride and a second dielectric layer that includes silicon oxide.

Referring to FIGS. 2B-2C, the device 200 further includes inner spacers 255 vertically between adjacent channel layers 215 and adjacent to the source/drain features 260. Inner spacers 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, inner spacers 255 include a low-k dielectric material. The gate spacers 247 and the inner spacers 255 are formed by deposition (e.g., CVD, PVD, ALD, etc.) and etching processes (e.g., dry etching).

In the embodiment depicted in FIGS. 2B-2C, the gate trench 275 is provided between opposing gate spacers 247 and opposing inner spacers 255. In the embodiment depicted in FIGS. 2D-2E, the gate trench 275 is provided between opposing gate spacers 247 and there are no inner spacers 255.

The device 200 further includes a contact etch stop layer (CESL) 268 disposed over the isolation features 230, the epitaxial source/drain features 260, and the gate spacers 247. The CESL 268 includes silicon and nitrogen, such as silicon nitride or silicon oxynitride. The CESL 268 may be formed by a deposition process, such as CVD, or other suitable methods. The device 200 further includes an inter-level dielectric (ILD) layer 270 over the CESL 268. The ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. The ILD layer 270 may be formed by a deposition process, such as CVD, flowable CVD (FCVD), or other suitable methods.

At the operation 104, the method 100 (FIG. 1A) forms an interfacial oxide layer 280 over the channel layer 215, such as shown in FIG. 3A. For simplicity, FIGS. 3A-8E only illustrate one channel layer 215 and various layers formed over the channel layer 215. The channel layer 215 shown in FIGS. 3A-8E can be one of the channel layers 215 in FIGS. 2B-2C, the channel layer 215 in FIGS. 2D-2E, or another channel layer not illustrated in FIGS. 2B-2E.

The interfacial oxide layer 280 includes a dielectric material, such as $SiO_2$, HfSiO, SiON, other silicon-containing dielectric material, other suitable dielectric material, or combinations thereof. The interfacial oxide layer 280 is formed by any of the processes described herein, such as thermal oxidation, chemical oxidation, ALD, CVD, other suitable process, or combinations thereof. In some embodiments, the interfacial oxide layer 280 has a thickness of about 0.5 nm to about 3 nm. In the present embodiment, the channel layer 215 includes germanium. For example, the channel layer 215 includes silicon germanium, germanium tin, or other germanium-containing semiconductor material(s). Further, when the interfacial oxide layer 280 is initially formed, it further includes germanium oxide (e.g., $GeO_2$). For example, the interfacial oxide layer 280 may include germanium oxide, silicon germanium oxide (SiGeO) or germanium tin oxide (GeSnO). Since germanium oxide is unstable, it is desirable to remove or substantially reduce the content of germanium oxide in the interfacial oxide layer 280.

At the operation 106, the method 100 (FIG. 1A) forms a high-k gate dielectric layer 282 over the interfacial oxide layer 280, such as shown in FIG. 3B. The high-k gate dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof. In an embodiment, the high-k gate dielectric layer 282 includes a layer of $HfO_2$ and a layer of $ZrO_2$ over the layer of $HfO_2$. High-k dielectric material generally refers to dielectric materials having a high dielectric constant, for example, greater than that of silicon oxide (k≈3.9). The high-k gate dielectric layer 282 is formed by any of the processes described herein, such as ALD, CVD, PVD, oxidation-based deposition process, other suitable process, or combinations thereof. In some embodiments, the high-k gate dielectric layer 282 has a thickness of about 1 nm to about 3 nm.

At operation 108, the method 100 (FIG. 1B) forms a metal nitride layer 284 over the high-k gate dielectric layer 282, such as shown in FIG. 3C. The metal nitride layer 284 may include titanium nitride (TiN), tantalum nitride (TaN), or other metal nitride material(s). The metal nitride layer 284 may be deposited by any of the processes described herein, such as ALD, CVD, or PVD. In some embodiments, the metal nitride layer 284 has a thickness of about 1.0 nm to about 1.5 nm. In some embodiments, the method 100 may optionally treat the metal nitride layer 284 with a nitrogen-containing gas (referred to as N treatment). The N treatment results in a higher metal nitride (e.g., titanium nitride) to metal oxide (e.g., titanium oxide) ratio and reduces oxygen source for $T_{ox}$ (oxide thickness) reduction in the high-k gate dielectric layer 282. For example, the method 100 may apply $NH_3$ gas to the metal nitride layer 284 at a temperate in the range of 400° C. to 500° C. for about 10 seconds to 120 seconds.

At operation 110, the method 100 (FIG. 1B) performs a metal treatment (referred to as Mx treatment) to the metal nitride layer 284 using a metal-containing gas. This effectively forms a layer 286 over the metal nitride layer 284, such as shown in FIG. 3D. The layer 286 includes one or more metals and is thus referred to as a metal layer 286. In an embodiment, the Mx treatment applies a gas for depositing Ti (thus, the resulting metal layer 286 includes Ti), such as $TiCl_4$. To further this embodiment, the Mx treatment may be performed at a temperate in the range of 400° C. to 500° C. for about 10 seconds to 120 seconds. In another embodiment, the Mx treatment applies a gas for depositing Ta (thus, the resulting metal layer 286 includes Ta), such as PDMAT (Pentakis(dimethylamino)tantalum). To further this embodiment, the Mx treatment may be performed at a temperate in the range of 250° C. to 350° C. for about 10 seconds to 120 seconds. In another embodiment, the Mx treatment applies a gas for depositing Mo (thus, the resulting metal layer 286 includes Mo), such as $MoCl_4O$ (molybdenum chloride oxide). To further this embodiment, the Mx treatment may be performed at a temperate in the range of 350° C. to 450° C. for about 10 seconds to 60 seconds. In yet another embodiment, the Mx treatment applies a gas for depositing W (thus, the resulting metal layer 286 includes W), such as $WF_6$ (tungsten hexafluoride). To further this embodiment, the Mx treatment may be performed at a temperate in the range of 350° C. to 450° C. for about 5 seconds to 20 seconds.

In some embodiments, the Mx treatment includes applying a silicon-containing gas immediately after applying a metal-containing gas such as one of those metal-containing gases discussed above. For example, the Mx treatment may apply $TiCl_4$ gas followed by a silicon-containing gas such as $SiH_4$ or $Si_2H_6$ at a temperate in the range of 400° C. to 500° C. and may repeatedly apply the two gases in an alternating manner for total duration of about 10 seconds to 360 seconds. For another example, the Mx treatment may apply PDMAT gas followed by a silicon-containing gas such as $SiH_4$ or $Si_2H_6$ at a temperate in the range of 250° C. to 500° C. and may repeatedly apply the two gases in an alternating manner for total duration of about 10 seconds to 360 seconds.

In the above embodiments, the ranges of process temperature and process time are specifically tuned to provide sufficient treatment (thus sufficient thickness in the metal layer 286) without over-treatment where metal residue from the metal layer 286 would be difficult to remove in a subsequent fabrication stage. Metal residue may adversely impact electrical performance of the device 200. If the process temperature is too high or the process time is too long, it would result in metal residue from the metal layer 286. If the process temperature is too low or the process time is too short, it would not produce sufficient thickness in the metal layer 286 for scavenging oxygen described below.

In an embodiment, the type of metal used in the Mx treatment (thus, the metal included in the metal layer 286) is selected based on the material in the channel layer 215. For example, if the channel layer 215 includes silicon germanium, the interfacial oxide layer 280 likely contains germanium oxide (such as $GeO_2$ or GeO) in addition to silicon dioxide. In such case, the Mx treatment may apply one or more of $MoCl_4O$, $WF_6$, $TiCl_4$, or PDMAT. The metal layer 286 may thus include one or more of Mo, W, Ti, and Ta. Any of these metal species, Mo, W, Ti, and Ta, is capable of scavenging oxygen from germanium oxide without creating vacancies in the high-k gate dielectric layer 282 and the interfacial oxide layer 280, thereby reducing the content of germanium oxide in the interfacial oxide layer 280. For another example, if the channel layer 215 includes germanium tin, the interfacial oxide layer 280 likely contains germanium oxide in addition to tin dioxide. In such case, the Mx treatment may apply one or more of $MoCl_4O$ and $WF_6$. The metal layer 286 may thus include one or more of Mo and W. Any of the metal species, Mo and W, is capable of scavenging oxygen from germanium oxide without creating vacancies in the high-k gate dielectric layer 282 and the interfacial oxide layer 280, thereby reducing the content of germanium oxide in the interfacial oxide layer 280.

Figure 1B:
Figure 1H:
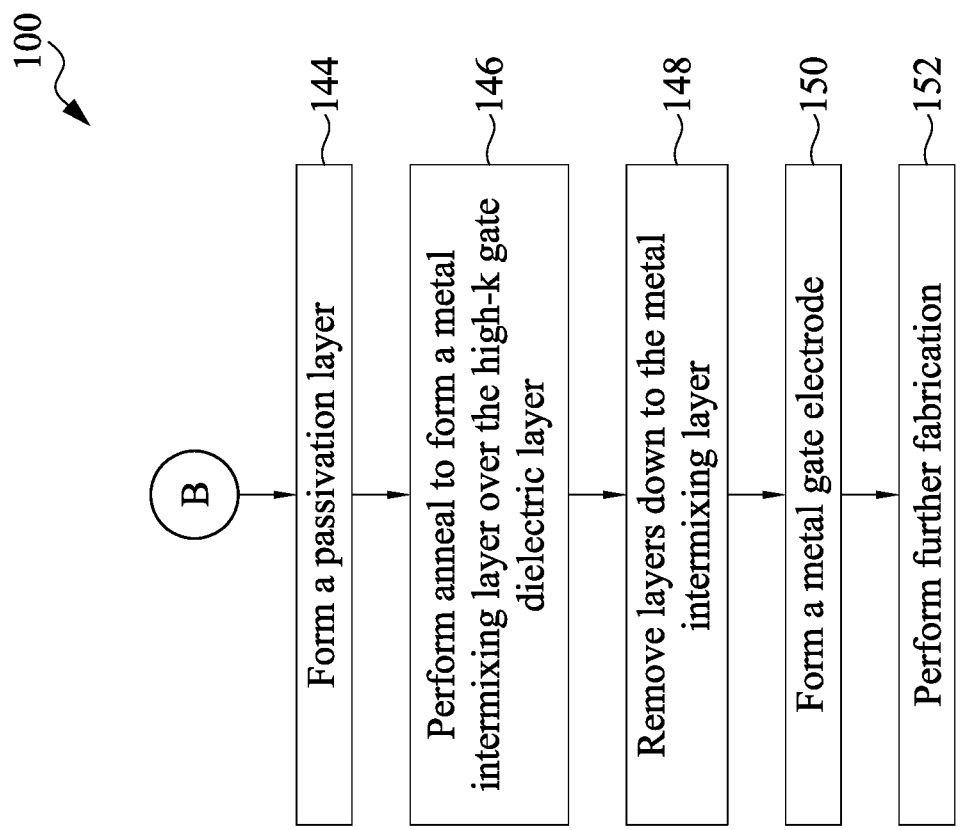
Figure 1G:
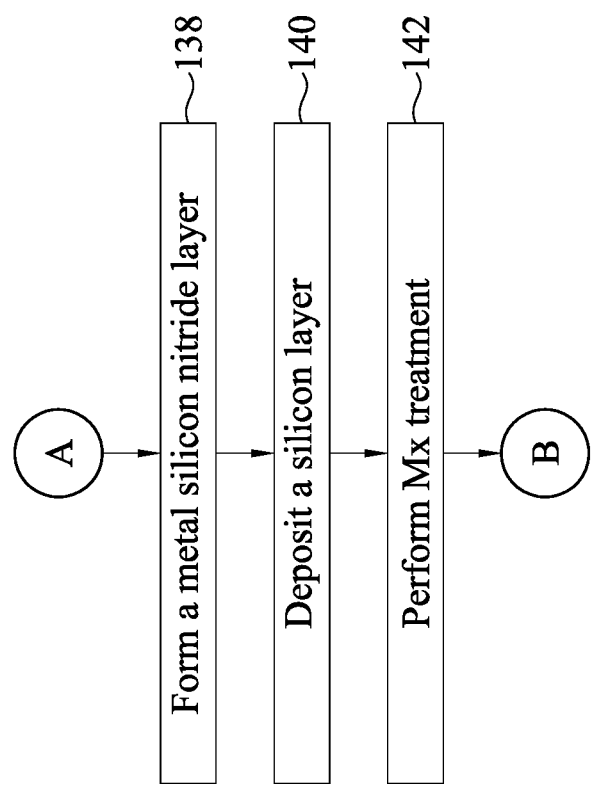

In the embodiment shown in FIGS. 1A, 1B, and 1H, the method 100 proceeds from operation 110 to operation 144 (FIG. 1H) to form a passivation layer 288, such as shown in FIG. 3E. The method 100 may perform additional operations between operation 110 and operation 144 in some embodiments. In the present embodiment, the passivation layer 288 includes silicon and may have a thickness in a range from about 1.0 nm to about 1.5 nm. The passivation layer 288 may be deposited by any of the processes described herein, such as ALD or CVD. Further, in this embodiment, the passivation layer 288 is deposited in-situ. In other words, the passivation layer 288 is deposited in the same process chamber where the Mx treatment is performed without moving the device 200 in and out of the process chamber.

At operation 146, the method 100 (FIG. 1H) performs an annealing process to the device 200. The temperature and duration of the annealing process is tuned such that the germanium oxygen bonds in the interfacial oxide layer 280 are broken and oxygen are attracted by the metal layer 286 to form metal oxides that are more stable than germanium oxide. In an embodiment, the annealing process applies a rapid thermal annealing (RTA) which includes a soak annealing at a temperature in a range from about 500° C. to about 600° C. for about 5 seconds to 20 seconds followed by a spike annealing at a temperature in a range from about 800° C. to about 900° C. for about 1 second to 3 seconds.

The effects of the operation 146 are multifold. First, it converts the metal layer 286, partially or fully, into a metal oxide layer 286' (FIG. 3F). The metal oxide layer 286' may include one or more of $Mo_2O_3$, $WO_3$, $TiO_2$, and $TaO_2$, depending on the metal(s) in the metal layer 286 as discussed above. Second, it produces a metal intermixing layer 283 between the high-k gate dielectric layer 282 and the metal nitride layer 284 (FIG. 3F). The metal intermixing layer 283 includes a metal oxide having metal species from the high-k gate dielectric layer 282 and additional metal species from the metal-containing gas applied during the operation 110. For example, in an embodiment where the high-k gate dielectric layer 282 includes $HfO_2$, the metal intermixing layer 283 includes Hf, O, and one or more metal species (such as Mo, W, Ti, and Ta) from the metal layer 286. Third, a germanium-rich semiconductor layer 216 may be formed after some of the oxygen in the interfacial oxide layer 280 are attracted to the metal oxide layer 286'. The germanium-rich semiconductor layer 216 sits between the channel layer 215 and the interfacial oxide layer 280. The germanium-rich semiconductor layer 216 includes the same elements as the channel layer 215 but with a higher germanium content. For example, in an embodiment where the channel layer 215 includes $Si_xGe_{1-x}$, the germanium-rich semiconductor layer 216 includes $Si_yGe_{1-y}$ where y is smaller than x. For example, y is smaller than x by 2 to 15 in some embodiments. For another example, in an embodiment where the channel layer 215 includes $Sn_xGe_{1-x}$, the germanium-rich semiconductor layer 216 includes $Sn_yGe_{1-y}$, where y is smaller than x. For example, y is smaller than x by 2 to 15 in some embodiments.

At operation 148, the method 100 (FIG. 1H) removes the layers over the high-k gate dielectric layer 282 except a portion of the metal intermixing layer 283, such as shown in FIG. 3G. In an embodiment, operation 148 includes applying a wet etchant (Metal Removal Chemical) that etches the passivation layer 288, the metal oxide layer 286', and the metal nitride layer 284. The wet etchant may be applied at a temperature in a range from about 50° C. to about 80° C. and for about 150 seconds to 400 seconds. If the application temperature is too high or the application time is too long, it would completely remove the metal intermixing layer 283 and undesirably remove some of the high-k gate dielectric layer 282. If the application temperature is too low or the application time is too short, it may not completely remove the metal nitride layer 284, which would undesirably leave certain metal residues in the gate structure of the device 200. In some embodiments, a portion of the metal intermixing layer 283 of about 1 Å to 3 Å thick remains after the operation 148 completes.

Figures 9A, 9B:
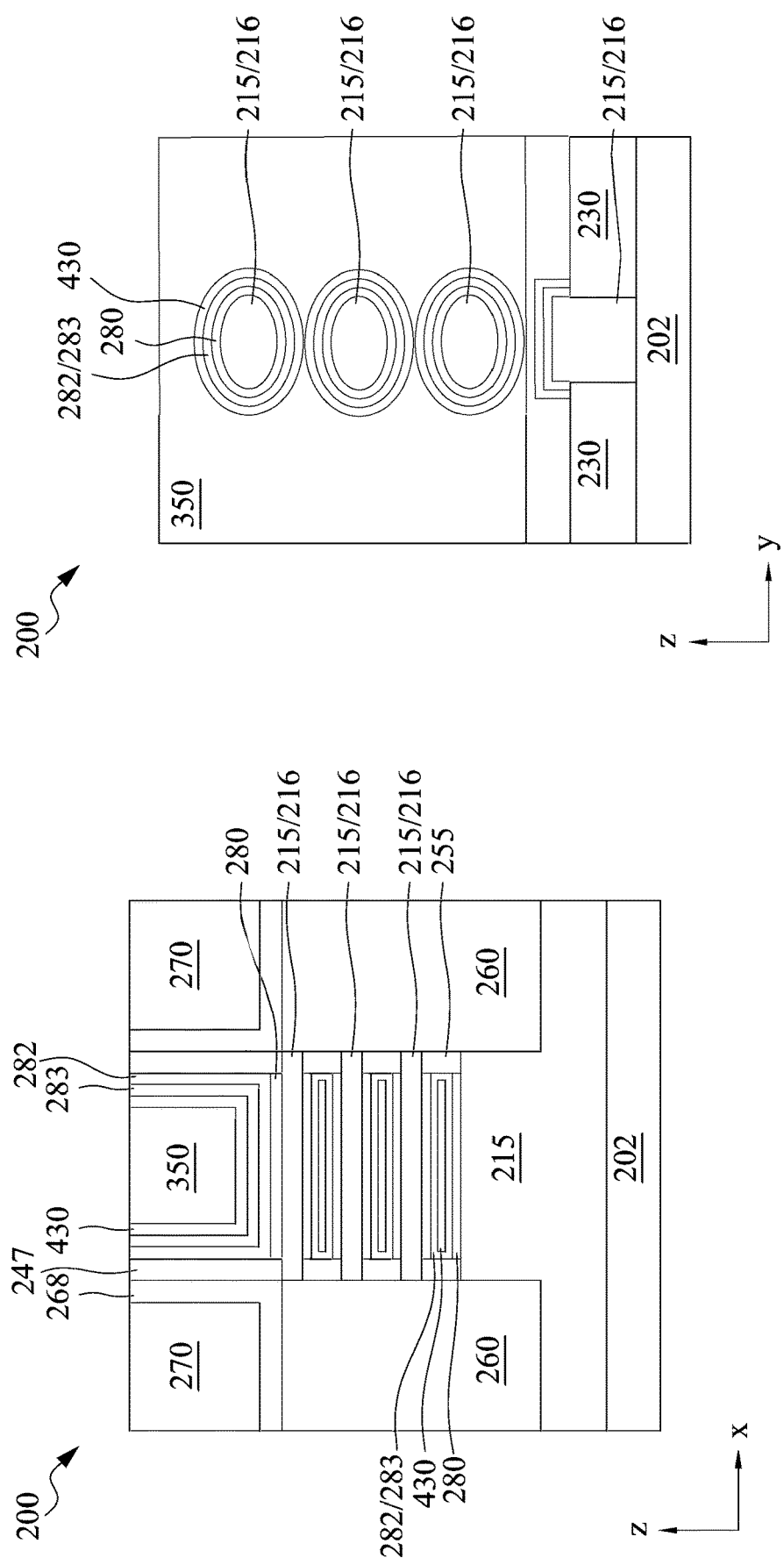
FIGS. 9A and 9B are diagrammatic cross-sectional views of the semiconductor device in FIG. 2A, in portion, according to an embodiment of the present disclosure.
Figure 10B:
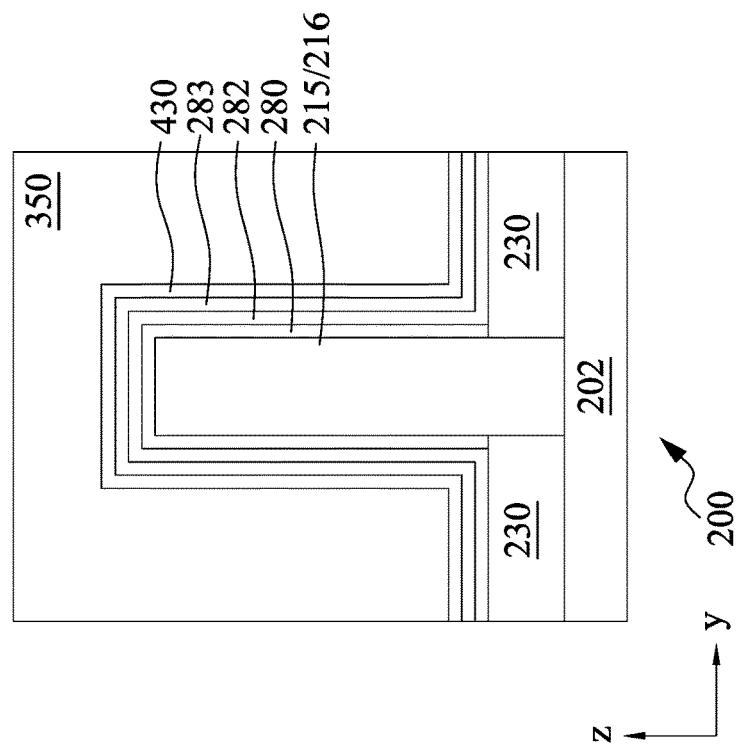
FIGS. 10A and 10B are diagrammatic cross-sectional views of the semiconductor device in FIG. 2A, in portion, according to another embodiment of the present disclosure.
Figure 10A:
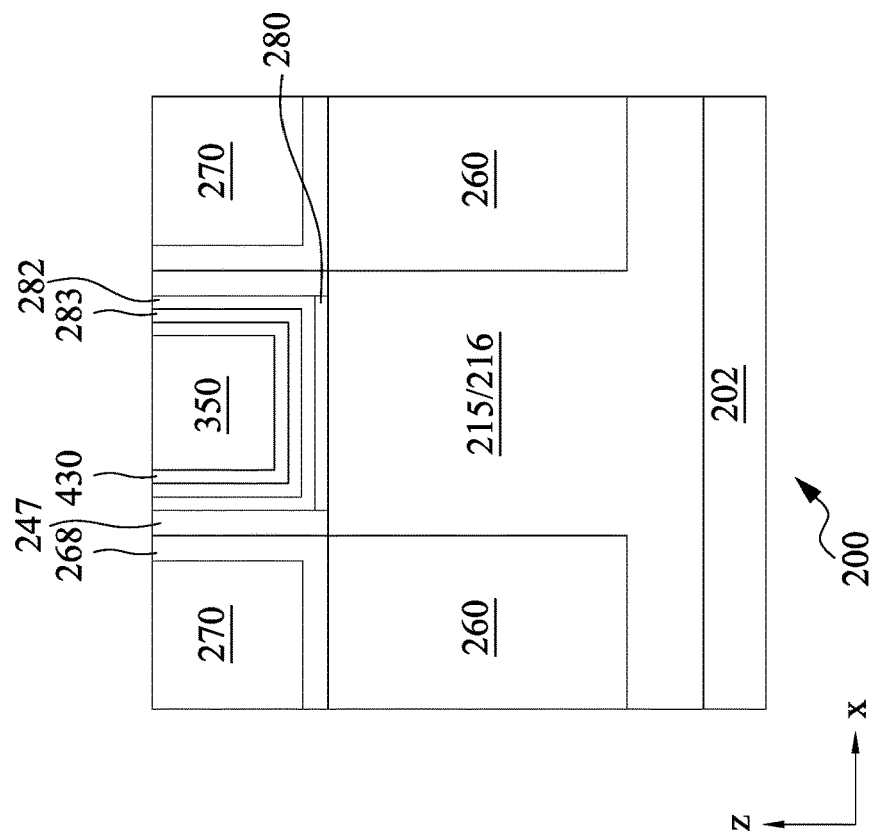

At operation 150, the method 100 (FIG. 1H) forms a metal gate electrode 352 over the high-k gate dielectric layer 282 and the metal intermixing layer 283. The metal gate electrode 352 may include a work function metal layer 430 and a bulk metal layer 350, such as shown in FIG. 3H. The work function metal layer 430 is designed to provide a proper work function for the type of the device 200. In embodiments where the device 200 is an n-type transistor, the work function metal layer 430 includes an n-type work function metal, such as Ti, Al, Ag, Mn, Zr, TiC, TiAl, TiAlC, TiAlSiC, TaC, TaCN, TaSiN, TaAl, TaAlC, TaSiAlC, TiAlN, other n-type work function material, or combinations thereof. In embodiments where the device 200 is a p-type transistor, the work function metal layer 430 includes a p-type work function metal, such as TiN, TaN, TaSN, Ru, Mo, Al, WN, WCN $ZrSi_2$, $MoSi_2$, $TaSi_2$, $NiSi_2$, other p-type work function material, or combinations thereof. In some embodiments, the work function metal layer 430 has a thickness of about 2 nm to about 5 nm. The bulk metal layer 350 includes a suitable conductive material, such as Al, W, and/or Cu. The bulk metal layer 350 may additionally or collectively include other metals, metal oxides, metal nitrides, other suitable materials, or combinations thereof. In some implementations, a blocking layer (not shown) is optionally formed (e.g., by ALD) between the work function metal layer 430 and the bulk metal layer 350, such that the bulk metal layer 350 is disposed on the blocking layer. The work function metal layer 430 and the bulk metal layer 350 may be deposited using any suitable process, such as CVD, PVD, ALD, and plating. After the bulk metal layer 350 is deposited, a planarization process may then be performed to remove excess gate materials from the device 200. For example, a CMP process is performed until a top surface of ILD layer 270 is reached (exposed), such as shown in FIGS. 9A, 9B, 10A, and 10B. Specifically, FIGS. 9A and 9B show the device 200 in the GAA embodiment of FIGS. 2B and 2C after going through the various fabrication steps of FIGS. 1A, 1B, and 1H. FIGS. 10A and 10B show the device 200 in the FinFET embodiment of FIGS. 2D and 2E after going through the various fabrication steps of FIGS. 1A, 1B, and 1H.

At operation 152, the method 100 (FIG. 1H) performs further fabrication to the device 200. For example, it may form S/D contacts that electrically connect to the S/D features 260, form gate vias that electrically connect to the metal gate electrode 352, and form multi-layer interconnects that connect the device 200 to other transistors to form a complete IC.

The second embodiment of the present disclosure is described below by referring to FIGS. 1A, 1C, 1H, 2A-2E, 4A-4E, and 9A-10B. FIGS. 1A, 1H, 2A-2E, and 9A-10B have been discussed above with reference to the first embodiment. Thus, some of the details of these figures are omitted below for brevity.

Figure 4A:
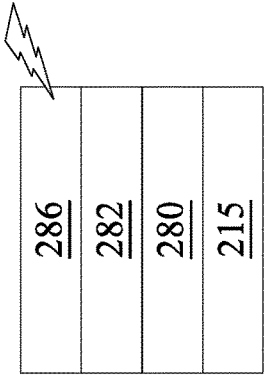
FIGS. 4A, 4B, 4C, 4D, and 4E are diagrammatic cross-sectional views of the semiconductor device in FIG. 2A, in portion, at various fabrication stages (such as those associated with the method in FIGS. 1A, 1C, and 1H) according to various aspects of the present disclosure.

In the second embodiment, the method 100 (FIG. 1A) performs operations 102, 104, and 106 (FIG. 1A) to provide an intermediate structure of the device 200 (such as shown in FIGS. 2A-2E), form an interfacial oxide layer 280 over a channel layer 215, and form a high-k gate dielectric layer 282 over the interfacial oxide layer 280, such as shown in FIG. 4A.

Then, at operation 112, the method 100 (FIG. 1C) performs a Mx treatment to the high-k gate dielectric layer 282, which forms a metal layer 286, as shown in FIG. 4A. The Mx treatment in this operation is similar to the Mx treatment in operation 110. For example, operation 112 may apply a metal-containing gas such as $TiCl_4$, PDMAT, $MoCl_4O$, or $WF_6$, and the resulting metal layer 286 may include Ti, Ta, Mo, or W, respectively. Operation 112 may also apply a silicon-containing gas after applying a metal-containing gas. Further, the type of metal used in the Mx treatment (thus, the metal included in the metal layer 286) is selected based on the material in the channel layer 215 as discussed above for operation 110.

Figure 4B:
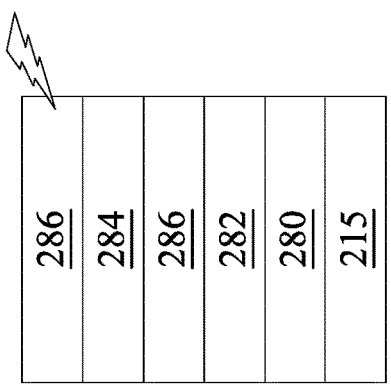

At operation 114, the method 100 (FIG. 1C) forms a metal nitride layer 284 over the metal layer 286, such as shown in FIG. 4B. The metal nitride layer 284 may include titanium nitride (TiN), tantalum nitride (TaN), or other metal nitride material(s). Further, in some embodiments, the method 100 may optionally treat the metal nitride layer 284 with a nitrogen-containing gas, as discussed above for operation 108. In some embodiments, the thickness of the metal nitride layer 284 in FIG. 4B is a fraction (e.g., ½ or ⅓) of the thickness of the metal nitride layer 284 in FIG. 3C.

Figure 4C:
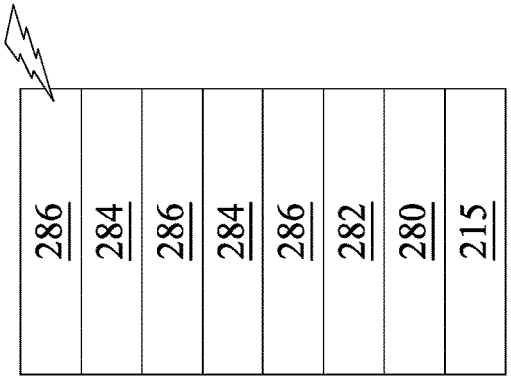

The method 100 may repeat operations 112 and 114 a few times (such as 2 times, 3 times, and so on). As shown in FIGS. 4B and 4C, multiple metal layers 286 and multiple metal nitride layers 284 may be alternately stacked over the high-k gate dielectric layer 282. It is noted that the subsequent Mx treatment(s) are performed to the metal nitride layer 284, not the high-k gate dielectric layer 282.

Figure 4D:
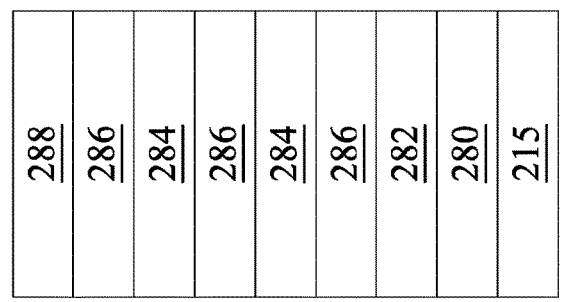
Figure 4E:
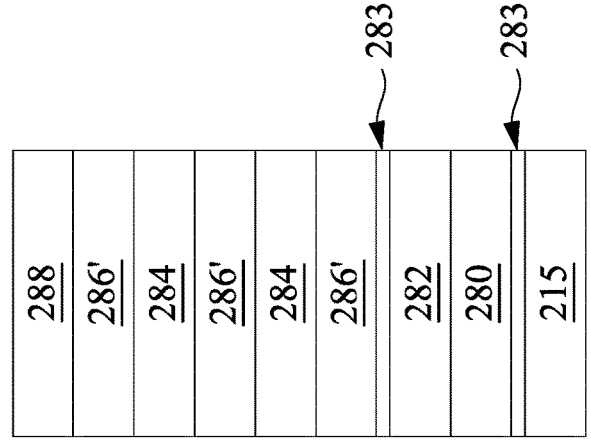

At operation 116, the method 100 (FIG. 1C) performs a Mx treatment to the topmost layer of the metal nitride layers 284 and forms a topmost layer of the metal layers 286, such as shown in FIG. 4C. Then, the method 100 proceeds to operation 144 (FIG. 1H) to form a passivation layer 288, such as shown in FIG. 4D. Then, at operation 146, the method 100 (FIG. 1H) performs an annealing process, which converts each of the metal layers 286, partially or fully, into a respective metal oxide layer 286' as shown in FIG. 4E. It also produces the metal intermixing layer 283 and the germanium-rich semiconductor layer 216 (FIG. 4E). Then, at operation 148, the method 100 (FIG. 1H) removes the layers over the high-k gate dielectric layer 282 except a portion of the metal intermixing layer 283, such as shown in FIG. 3G. Then, at operation 150, the method 100 (FIG. 1H) forms a metal gate electrode 352 over the high-k gate dielectric layer 282 and the metal intermixing layer 283. The metal gate electrode 352 may include a work function metal layer 430 and a bulk metal layer 350, such as shown in FIGS. 3H and 9A-10B. At operation 152, the method 100 (FIG. 1H) performs further fabrication, as discussed above with reference to the first embodiment.

The third embodiment of the present disclosure is described below by referring to FIGS. 1A, 1D, 1H, 2A-2E, 5A-5E, and 9A-10B. FIGS. 1A, 1H, 2A-2E, and 9A-10B have been discussed above with reference to the first embodiment. Thus, some of the details of these figures are omitted below for brevity.

Figure 5C:
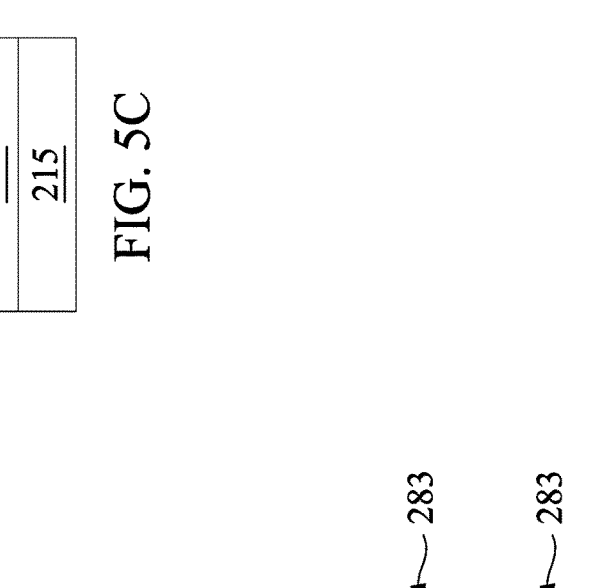
FIGS. 5A, 5B, 5C, 5D, and 5E are diagrammatic cross-sectional views of the semiconductor device in FIG. 2A, in portion, at various fabrication stages (such as those associated with the method in FIGS. 1A, 1D, and 1H) according to various aspects of the present disclosure.
Figure 5B:
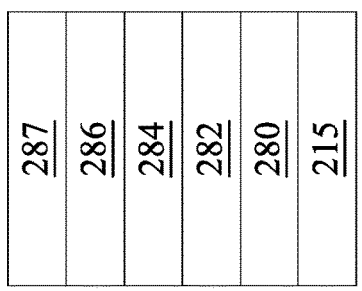
Figure 5E:
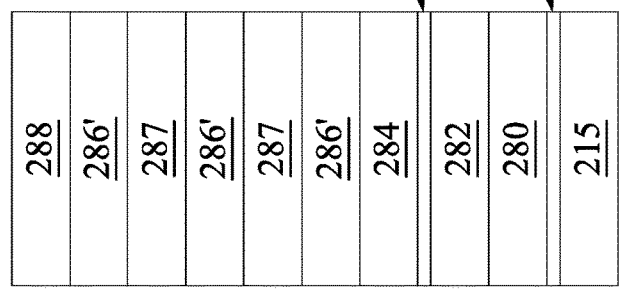
Figure 5A:
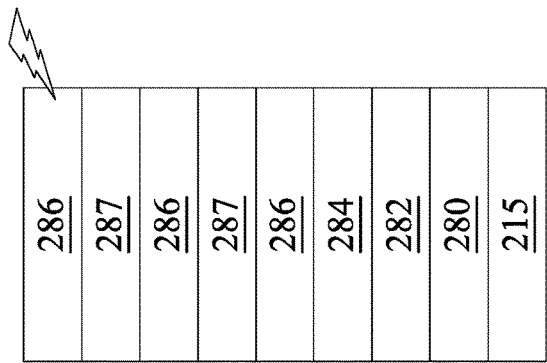

In the third embodiment, the method 100 (FIG. 1A) performs operations 102, 104, and 106 (FIG. 1A) to provide an intermediate structure of the device 200 (such as shown in FIGS. 2A-2E), form an interfacial oxide layer 280 over a channel layer 215, and form a high-k gate dielectric layer 282 over the interfacial oxide layer 280, such as shown in FIG. 5A.

Then, at operation 118, the method 100 (FIG. 1D) forms a metal nitride layer 284 over the high-k gate dielectric layer 282, such as shown in FIG. 5A. The metal nitride layer 284 may include titanium nitride (TiN), tantalum nitride (TaN), or other metal nitride material(s). Further, in some embodiments, the method 100 may optionally treat the metal nitride layer 284 with a nitrogen-containing gas, as discussed above for operation 108.

Then, at operation 120, the method 100 (FIG. 1D) performs a Mx treatment to the metal nitride layer 284, which forms a metal layer 286, as shown in FIG. 5A. The Mx treatment in this operation is similar to the Mx treatment in operation 110. For example, operation 120 may apply a metal-containing gas such as $TiCl_4$, PDMAT, $MoCl_4O$, or $WF_6$, and the resulting metal layer 286 may include Ti, Ta, Mo, or W, respectively. Operation 120 may also apply a silicon-containing gas after applying a metal-containing gas. Further, the type of metal used in the Mx treatment (thus, the metal included in the metal layer 286) is selected based on the material in the channel layer 215 as discussed above for operation 110.

At operation 122, the method 100 (FIG. 1D) deposits a silicon layer 287 over the metal layer 286, such as shown in FIG. 5B. In an embodiment, the silicon layer 287 is deposited using ALD (atomic layer deposition) and may be deposited to a thickness about 5 Å to about 20 Å. For example, the silicon layer 287 may be deposited using ALD with $SiH_4$ gas at a temperature in a range from about 400° C. to 500° C. for about 60 seconds to 360 seconds. In another embodiment, the silicon layer 287 is deposited using CVD (chemical vapor deposition) and may be deposited to a thickness about 10 Å to about 30 Å. For example, the silicon layer 287 may be deposited using CVD with $Si_2H_6$ gas at a temperature in a range from about 400° C. to 500° C. for about 60 seconds to 360 seconds.

The method 100 may repeat operations 120 and 122 a few times (such as 2 times, 3 times, and so on). As shown in FIG. 5C, multiple metal layers 286 and multiple silicon layers 287 may be alternately stacked over the metal nitride layer 284. It is noted that the subsequent Mx treatment(s) are performed to the silicon layer 287, not the metal nitride layer 284.

Figure 5D:
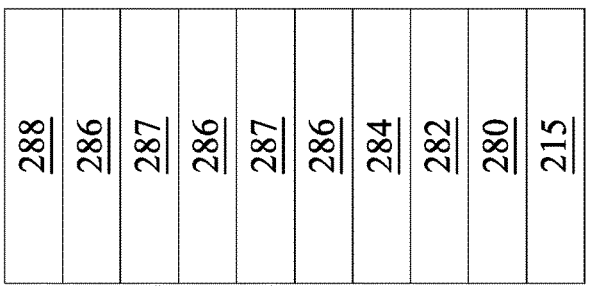

At operation 124, the method 100 (FIG. 1D) performs a Mx treatment to the topmost layer of the silicon layers 287 and forms a topmost layer of the metal layers 286, such as shown in FIG. 5C. Then, the method 100 proceeds to operation 144 (FIG. 1H) to form a passivation layer 288, such as shown in FIG. 5D. Then, at operation 146, the method 100 (FIG. 1H) performs an annealing process, which converts each of the metal layers 286, partially or fully, into a respective metal oxide layer 286' as shown in FIG. 5E. It also produces the metal intermixing layer 283 and the germanium-rich semiconductor layer 216 (FIG. 5E). Then, at operation 148, the method 100 (FIG. 1H) removes the layers over the high-k gate dielectric layer 282 except a portion of the metal intermixing layer 283, such as shown in FIG. 3G. Then, at operation 150, the method 100 (FIG. 1H) forms a metal gate electrode 352 over the high-k gate dielectric layer 282 and the metal intermixing layer 283. The metal gate electrode 352 may include a work function metal layer 430 and a bulk metal layer 350, such as shown in FIGS. 3H and 9A-10B. At operation 152, the method 100 (FIG. 1H) performs further fabrication, as discussed above with reference to the first embodiment.

The fourth embodiment of the present disclosure is described below by referring to FIGS. 1A, 1E, 1H, 2A-2E, 6A-6D, and 9A-10B. FIGS. 1A, 1H, 2A-2E, and 9A-10B have been discussed above with reference to the first embodiment. Thus, some of the details of these figures are omitted below for brevity.

In the fourth embodiment, the method 100 (FIG. 1A) performs operations 102, 104, and 106 (FIG. 1A) to provide an intermediate structure of the device 200 (such as shown in FIGS. 2A-2E), form an interfacial oxide layer 280 over a channel layer 215, and form a high-k gate dielectric layer 282 over the interfacial oxide layer 280, such as shown in FIG. 6A.

Then, at operation 126, the method 100 (FIG. 1E) performs a Mx treatment to the high-k gate dielectric layer 282, which forms a metal layer 286, as shown in FIG. 6A. The Mx treatment in this operation is similar to the Mx treatment in operation 110. For example, operation 126 may apply a metal-containing gas such as $TiCl_4$, PDMAT, $MoCl_4O$, or $WF_6$, and the resulting metal layer 286 may include Ti, Ta, Mo, or W, respectively. Operation 126 may also apply a silicon-containing gas after applying a metal-containing gas. Further, the type of metal used in the Mx treatment (thus, the metal included in the metal layer 286) is selected based on the material in the channel layer 215 as discussed above for operation 110. In an embodiment, operation 126 applies $TiCl_4$ gas at a temperature in a range of about 400° C. to about 500° C. for about 10 seconds to 60 seconds. To further this embodiment, the metal layer 286 includes a layer of Ti about 1 Å to 3 Å thick.

At operation 128, the method 100 (FIG. 1E) forms a metal nitride layer 284 over the metal layer 286, such as shown in FIG. 6B. The metal nitride layer 284 may include titanium nitride (TiN), tantalum nitride (TaN), or other metal nitride material(s). Further, in some embodiments, the method 100 may optionally treat the metal nitride layer 284 with a nitrogen-containing gas, as discussed above for operation 108.

Then, the method 100 proceeds to operation 144 (FIG. 1H) to form a passivation layer 288 over the metal nitride layer 284, such as shown in FIG. 6C. Then, at operation 146, the method 100 (FIG. 1H) performs an annealing process, which converts the metal layer 286, partially or fully, into a metal oxide layer 286' as shown in FIG. 6D. It also produces the metal intermixing layer 283 and the germanium-rich semiconductor layer 216 (FIG. 6D). Then, at operation 148, the method 100 (FIG. 1H) removes the layers over the high-k gate dielectric layer 282 except a portion of the metal intermixing layer 283, such as shown in FIG. 3G. Then, at operation 150, the method 100 (FIG. 1H) forms a metal gate electrode 352 over the high-k gate dielectric layer 282 and the metal intermixing layer 283. The metal gate electrode 352 may include a work function metal layer 430 and a bulk metal layer 350, such as shown in FIGS. 3H and 9A-10B. At operation 152, the method 100 (FIG. 1H) performs further fabrication, as discussed above with reference to the first embodiment.

The fifth embodiment of the present disclosure is described below by referring to FIGS. 1A, 1F, 1H, 2A-2E, 7A-7F, and 9A-10B. FIGS. 1A, 1H, 2A-2E, and 9A-10B have been discussed above with reference to the first embodiment. Thus, some of the details of these figures are omitted below for brevity.

Figure 7A:
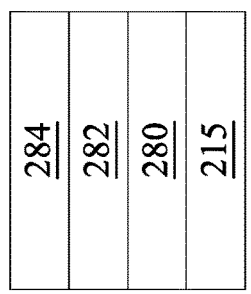
FIGS. 7A, 7B, 7C, 7D, 7E, and 7F are diagrammatic cross-sectional views of the semiconductor device in FIG. 2A, in portion, at various fabrication stages (such as those associated with the method in FIGS. 1A, 1F, and 1H) according to various aspects of the present disclosure.

In the fifth embodiment, the method 100 (FIG. 1A) performs operations 102, 104, and 106 (FIG. 1A) to provide an intermediate structure of the device 200 (such as shown in FIGS. 2A-2E), form an interfacial oxide layer 280 over a channel layer 215, and form a high-k gate dielectric layer 282 over the interfacial oxide layer 280, such as shown in FIG. 7A.

Then, at operation 132, the method 100 (FIG. 1F) forms a metal nitride layer 284 over the high-k gate dielectric layer 282, such as shown in FIG. 7A. The metal nitride layer 284 may include titanium nitride (TiN), tantalum nitride (TaN), or other metal nitride material(s). Further, in some embodiments, the method 100 may optionally treat the metal nitride layer 284 with a nitrogen-containing gas, as discussed above for operation 108.

Figure 7B:
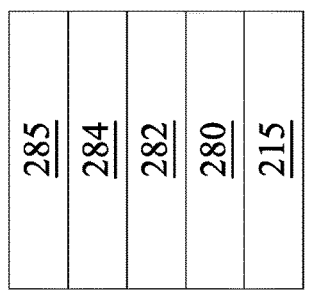

At operation 134, the method 100 (FIG. 1F) deposits a silicon layer 285 over the metal nitride layer 284, such as shown in FIG. 7B. The silicon layer 285 may be deposited using ALD or CVD (atomic layer deposition) and may be deposited to a thickness that is a fraction (such as ½ or ⅓) of the passivation layer 288 in the first embodiment.

Figure 7C:
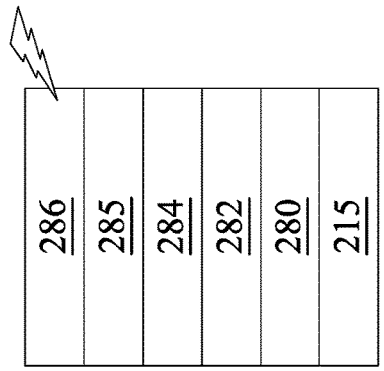

Then, at operation 136, the method 100 (FIG. 1D) performs a Mx treatment to the silicon layer 285, which forms a metal layer 286, as shown in FIG. 7C. The Mx treatment in this operation is similar to the Mx treatment in operation 110. For example, operation 136 may apply a metal-containing gas such as $TiCl_4$, PDMAT, $MoCl_4O$, or $WF_6$, and the resulting metal layer 286 may include Ti, Ta, Mo, or W, respectively. Operation 136 may also apply a silicon-containing gas after applying a metal-containing gas. Further, the type of metal used in the Mx treatment (thus, the metal included in the metal layer 286) is selected based on the material in the channel layer 215 as discussed above for operation 110.

Figure 7D:
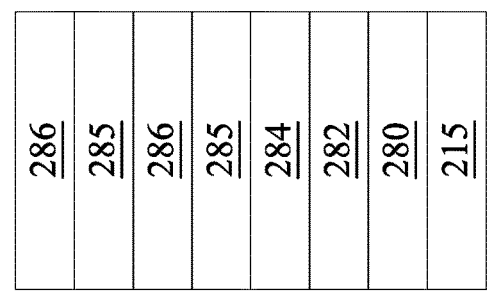
Figure 7E:
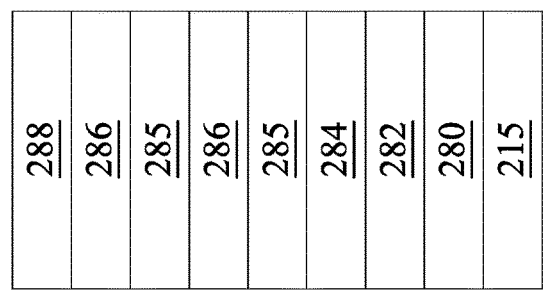
Figure 7F:
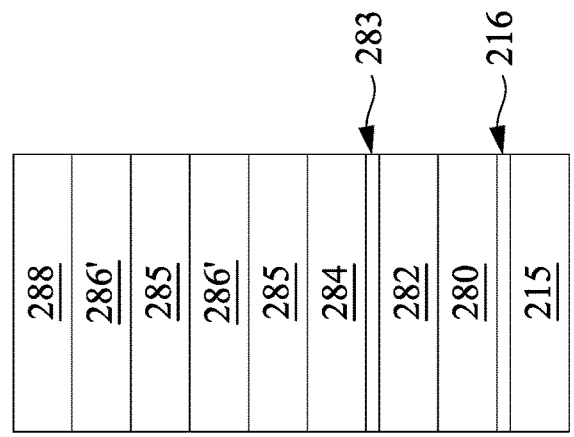

The method 100 may repeat operations 134 and 136 a few times (such as 2 times, 3 times, and so on). As shown in FIG. 7D, multiple metal layers 286 and multiple silicon layers 285 may be alternately stacked over the metal nitride layer 284. Then, the method 100 proceeds to operation 144 (FIG. 1H) to form a passivation layer 288 over the topmost metal layer 286, such as shown in FIG. 7E. It is noted that the multiple silicon layers 285 and the passivation layer 288 in the fifth embodiment have a total thickness that is equal to the thickness of the passivation layer 288 in the first embodiment. Then, at operation 146, the method 100 (FIG. 1H) performs an annealing process, which converts each of the metal layers 286, partially or fully, into a respective metal oxide layer 286' as shown in FIG. 7F. It also produces the metal intermixing layer 283 and the germanium-rich semiconductor layer 216 (FIG. 7F). Then, at operation 148, the method 100 (FIG. 1H) removes the layers over the high-k gate dielectric layer 282 except a portion of the metal intermixing layer 283, such as shown in FIG. 3G. Then, at operation 150, the method 100 (FIG. 1H) forms a metal gate electrode 352 over the high-k gate dielectric layer 282 and the metal intermixing layer 283. The metal gate electrode 352 may include a work function metal layer 430 and a bulk metal layer 350, such as shown in FIGS. 3H and 9A-10B. At operation 152, the method 100 (FIG. 1H) performs further fabrication, as discussed above with reference to the first embodiment.

The sixth embodiment of the present disclosure is described below by referring to FIGS. 1A, 1G, 1H, 2A-2E, 8A-8E, and 9A-10B. FIGS. 1A, 1H, 2A-2E, and 9A-10B have been discussed above with reference to the first embodiment. Thus, some of the details of these figures are omitted below for brevity.

Figure 8A:
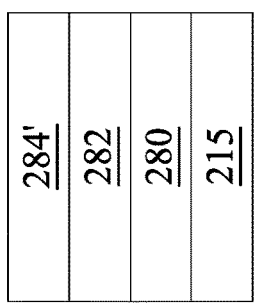
FIGS. 8A, 8B, 8C, 8D, and 8E are diagrammatic cross-sectional views of the semiconductor device in FIG. 2A, in portion, at various fabrication stages (such as those associated with the method in FIGS. 1A, 1G, and 1H) according to various aspects of the present disclosure.

In the sixth embodiment, the method 100 (FIG. 1A) performs operations 102, 104, and 106 (FIG. 1A) to provide an intermediate structure of the device 200 (such as shown in FIGS. 2A-2E), form an interfacial oxide layer 280 over a channel layer 215, and form a high-k gate dielectric layer 282 over the interfacial oxide layer 280, such as shown in FIG. 8A.

Then, at operation 138, the method 100 (FIG. 1G) forms a metal silicon nitride layer 284' over the high-k gate dielectric layer 282, such as shown in FIG. 8A. The metal silicon nitride layer 284' may include titanium silicon nitride (TiSiN), tantalum silicon nitride (TaSiN), or other metal silicon nitride material(s). Further, in some embodiments, the method 100 may optionally treat the metal silicon nitride layer 284' with a nitrogen-containing gas, as discussed above for operation 108. The metal silicon nitride layer 284' may be considered a species of the metal nitride layer 284.

Figure 8B:
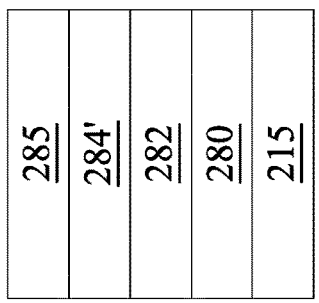

At operation 140, the method 100 (FIG. 1G) deposits a silicon layer 285 over the metal silicon nitride layer 284', such as shown in FIG. 8B. The silicon layer 285 may be deposited using ALD or CVD (atomic layer deposition) and may be deposited to a thickness that is a fraction (such as ½ or ⅓) of the passivation layer 288 in the first embodiment.

Figure 8C:
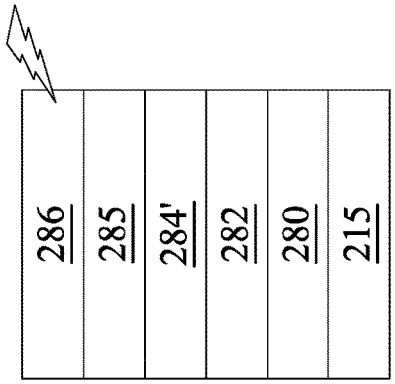

Then, at operation 142, the method 100 (FIG. 1G) performs a Mx treatment to the silicon layer 285, which forms a metal layer 286, as shown in FIG. 8C. The Mx treatment in this operation is similar to the Mx treatment in operation 110. For example, operation 142 may apply a metal-containing gas such as $TiCl_4$, PDMAT, $MoCl_4O$, or $WF_6$, and the resulting metal layer 286 may include Ti, Ta, Mo, or W, respectively. Operation 142 may also apply a silicon-containing gas after applying a metal-containing gas. Further, the type of metal used in the Mx treatment (thus, the metal included in the metal layer 286) is selected based on the material in the channel layer 215 as discussed above for operation 110. In an embodiment, operation 142 applies TiCl$_4$ gas at a temperature in a range of about 400° C. to about 500° C. for about 10 seconds to 30 seconds. To further this embodiment, the metal layer 286 includes a layer of Ti about 1 Å to 2 Å thick.

Figure 8D:
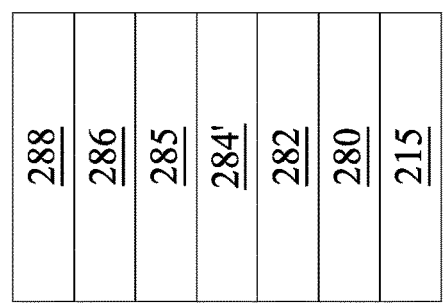
Figure 8E:
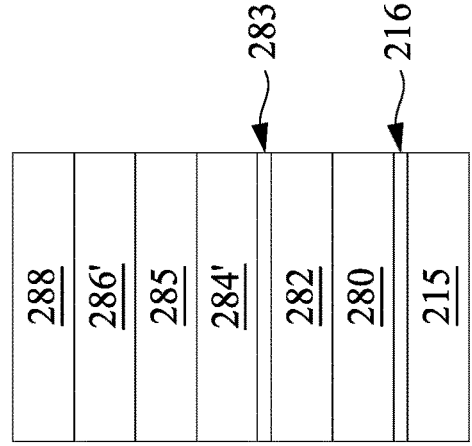

Then, the method 100 proceeds to operation 144 (FIG. 1H) to form a passivation layer 288 over the metal layer 286, such as shown in FIG. 8D. Then, at operation 146, the method 100 (FIG. 1H) performs an annealing process, which converts the metal layer 286, partially or fully, into a metal oxide layer 286' as shown in FIG. 8E. It also produces the metal intermixing layer 283 and the germanium-rich semiconductor layer 216 (FIG. 8E). Then, at operation 148, the method 100 (FIG. 1H) removes the layers over the high-k gate dielectric layer 282 except a portion of the metal intermixing layer 283, such as shown in FIG. 3G. Then, at operation 150, the method 100 (FIG. 1H) forms a metal gate electrode 352 over the high-k gate dielectric layer 282 and the metal intermixing layer 283. The metal gate electrode 352 may include a work function metal layer 430 and a bulk metal layer 350, such as shown in FIGS. 3H and 9A-10B. At operation 152, the method 100 (FIG. 1H) performs further fabrication, as discussed above with reference to the first embodiment.

Referring to FIGS. 3H, 9A, and 9B, in an embodiment where the device 200 is a GAA transistor, the channel layer 215 includes SiGe or GeSn where the Ge content in the channel layer 215 is in a range about 1 atomic percent (at %) to about 9 at %. If the Ge content is too high (e.g., more than 9 at %), the PMOS GAA may be overly boosted and become unbalanced with the NMOS GAA. If the Ge content is too low (e.g., less than 1 at %), the PMOS GAA may be degraded. Further, the germanium-rich layer 216 may be about 1 nm to 3 nm thick. If the germanium-rich layer 216 is too thick (e.g., more than 3 nm), the PMOS GAA may be overly boosted and become unbalanced with the NMOS GAA. If the germanium-rich layer 216 is too thin (e.g., less than 1 nm), the PMOS GAA may be degraded. Still further, the interfacial oxide layer 280 is SnO enriched or SiO$_2$ enriched. In an embodiment, the ratio of Sn to Ge in the interfacial oxide layer 280 is in a range about 1.1 to about 1.9. If this ratio is too high (e.g., more than 1.9), the PMOS GAA may be overly boosted and become unbalanced with the NMOS GAA. If this ratio is too low (e.g., less than 1.1), the PMOS GAA may be degraded. Furthermore, the metal intermixing layer 283 may have a thickness about 1 Å to about 25 Å. If the metal intermixing layer 283 is too thick (e.g., more than 25 Å), it might degrade the dielectric constant (K) in the effective gate oxide, and thus increase the effective oxide capacitance $C_{ox}$. If the metal intermixing layer 283 is too thin (e.g., more than 1 Å), it might decrease the effective oxide capacitance $C_{ox}$ and increase gate leakage. Still further, the content of the metal species in the metal intermixing layer 283 from the Mx treatment (not from the high-k gate dielectric layer 282) are about 3 at % to about 25 at %. If this content is too high (e.g., more than 25 at %), it might scavenge too much oxygen from the interfacial oxide layer 280, which would decrease the effective oxide capacitance $C_{ox}$ and increase gate leakage. If this content is too low (e.g., less than 3 at %), it might not have scavenged enough oxygen from the interfacial oxide layer 280 and thus the effective oxide capacitance $C_{ox}$ might be too high.

Referring to FIGS. 3H, 10A, and 10B, in an embodiment where the device 200 is a FinFET transistor, the channel layer 215 includes SiGe or GeSn. The germanium-rich layer 216 may be about 1 nm to 5 nm thick, and the Ge content in the germanium-rich layer 216 is higher than the Ge content in the channel layer 215 by about 2 at % to about 15 at %. If the germanium-rich layer 216 is too thick (e.g., more than 5 nm) or its Ge content is too high, the PMOS FinFET may be overly boosted and become unbalanced with the NMOS FinFET. If the germanium-rich layer 216 is too thin (e.g., less than 1 nm) or its Ge content is too low, the PMOS FinFET may be degraded. Further, the interfacial oxide layer 280 is SnO enriched or SiO$_2$ enriched. In an embodiment, the ratio of Si to Ge in the interfacial oxide layer 280 is in a range about 1.1 to about 2.3. If this ratio is too high (e.g., more than 2.3), the PMOS FinFET may be overly boosted and become unbalanced with the NMOS FinFET. If this ratio is too low (e.g., less than 1.1), the PMOS FinFET may be degraded. Furthermore, the metal intermixing layer 283 may have a thickness about 1 Å to about 25 Å. If the metal intermixing layer 283 is too thick (e.g., more than 25 Å), it might degrade the dielectric constant (K) in the effective gate oxide and thus increase the effective oxide capacitance $C_{ox}$. If the metal intermixing layer 283 is too thin (e.g., less than 1 Å), it might decrease the effective oxide capacitance $C_{ox}$ and increase gate leakage. Still further, the content of the metal species in the metal intermixing layer 283 from the Mx treatment (not from the high-k gate dielectric layer 282) are about 3 at % to about 25 at %. If this content is too high (e.g., more than 25 at %), it might scavenge too much oxygen from the interfacial oxide layer 280, which would decrease the effective oxide capacitance $C_{ox}$ and increase gate leakage. If this content is too low (e.g., less than 3 at %), it might not have scavenged enough oxygen from the interfacial oxide layer 280 and thus the effective oxide capacitance $C_{ox}$ might be too high.

Although not intended to be limiting, one or more embodiments of the present disclosure provide many benefits to a semiconductor device and the formation thereof. For example, embodiments of the present disclosure provide methods for improving the quality of gate dielectric layers (interfacial oxide layer and high-k gate dielectric layer) that are formed over a semiconductor channel layer having germanium. The methods allow selective oxygen scavenging from GeO$_x$ and boost oxide capacitance $C_{ox}$. Further, selective oxygen scavenging from GeO$_x$ creates SiO-rich SiGeO$_x$ interfacial oxide layer or SnO-rich GeSnO$_x$ interfacial oxide layer, thereby improving the density of interface traps (DITs), leakage performance, flicker noise issues, and so on. Furthermore, the methods form a Ge-rich channel layer due to GeO$_x$ reduction, which helps to boost channel mobility. The present embodiments can be readily integrated into existing semiconductor fabrication processes.

In one example aspect, the present disclosure is directed to a method that includes providing a structure having a substrate, a semiconductor channel layer over the substrate, an interfacial oxide layer over the semiconductor channel layer, and a high-k gate dielectric layer over the interfacial oxide layer, wherein the semiconductor channel layer includes germanium. The method further includes forming a metal nitride layer over the high-k gate dielectric layer; performing a first treatment to the structure using a metal-containing gas; after the performing of the first treatment, depositing a silicon layer over the metal nitride layer; and after the depositing of the silicon layer, annealing the structure such that a metal intermixing layer is formed over the high-k gate dielectric layer, wherein the metal intermixing layer includes a metal oxide having metal species from the high-k gate dielectric layer and additional metal species from the metal-containing gas.

In an embodiment of the method, the semiconductor channel layer includes silicon germanium or germanium tin. In a further embodiment, the semiconductor channel layer includes silicon germanium and the metal-containing gas includes $MoCl_4O$, $WF_6$, $TiCl_4$, or PDMAT. In another further embodiment, the semiconductor channel layer includes germanium tin and the metal-containing gas includes $MoCl_4O$ or $WF_6$.

In another embodiment of the method, the metal nitride layer includes titanium nitride, tantalum nitride, or titanium silicon nitride. In yet another embodiment of the method, the metal nitride layer is formed after the performing of the first treatment and before the depositing of the silicon layer. In a further embodiment, after the metal nitride layer is formed and before the depositing of the silicon layer, the method further includes performing a second treatment to the structure using the metal-containing gas. In a further embodiment, before the depositing of the silicon layer, the method further includes forming a second metal nitride layer after the performing of the second treatment and performing a third treatment to the structure using the metal-containing gas after the second metal nitride layer is formed.

In an embodiment, the method further includes performing a second treatment to the structure using a silicon-containing gas immediately after the performing of the first treatment. In a further embodiment, before the depositing of the silicon layer and after the performing of the second treatment, the method further includes depositing a second silicon layer over the metal nitride layer. In a further embodiment, before the depositing of the silicon layer and after the depositing of the second silicon layer, the method further includes performing a third treatment to the structure using the metal-containing gas and the silicon-containing gas.

In an embodiment, the method further includes depositing a second silicon layer over the metal nitride layer before the performing of the first treatment. In a further embodiment, after the performing of the first treatment and before the depositing of the silicon layer, the method further includes depositing a third silicon layer over the second silicon layer and performing a second treatment to the structure using the metal-containing gas.

In an embodiment, the method further includes removing the silicon layer and the metal nitride layer and keeping at least a portion of the metal intermixing layer in the structure and forming a metal gate electrode over the high-k gate dielectric layer and the metal intermixing layer.

In another example aspect, the present disclosure is directed to a method that includes providing a structure having a substrate, a semiconductor channel layer over the substrate, an interfacial oxide layer over the semiconductor channel layer, and a high-k gate dielectric layer over the interfacial oxide layer, wherein the semiconductor channel layer includes germanium. The method further includes forming a metal nitride layer over the high-k gate dielectric layer; after the forming of the metal nitride layer, performing a first treatment to the structure using a metal-containing gas; after the performing of the first treatment, depositing a passivation layer over the metal nitride layer, wherein the passivation layer includes silicon; after the depositing of the passivation layer, annealing the structure such that a metal intermixing layer is formed over the high-k gate dielectric layer, wherein the metal intermixing layer includes a metal oxide having metal species from the high-k gate dielectric layer and additional metal species from the metal-containing gas; removing the passivation layer and the metal nitride layer and keeping at least a portion of the metal intermixing layer in the structure; and forming a metal gate electrode over the high-k gate dielectric layer and the metal intermixing layer.

In an embodiment of the method, the metal nitride layer includes titanium nitride, tantalum nitride, or titanium silicon nitride, and the metal-containing gas includes $MoCl_4O$, $WF_6$, $TiCl_4$, or PDMAT. In another embodiment, before the depositing of the passivation layer, the method further includes depositing a silicon layer over the metal nitride layer.

In yet another example aspect, the present disclosure is directed to a semiconductor device that includes a substrate; a semiconductor channel layer over the substrate, wherein the semiconductor channel layer includes germanium; an interfacial oxide layer over the semiconductor channel layer; a high-k gate dielectric layer over the interfacial oxide layer; a metal intermixing layer over the high-k gate dielectric layer, wherein the metal intermixing layer includes a metal oxide having metal species from the high-k gate dielectric layer and additional metal species; and a metal gate electrode over the metal intermixing layer.

In an embodiment, the semiconductor device further includes a germanium-rich semiconductor layer over the semiconductor channel layer, wherein a germanium atomic percent in the germanium-rich semiconductor layer is higher than another germanium atomic percent in the semiconductor channel layer.

In an embodiment of the semiconductor device, the metal intermixing layer includes hafnium and one or more of Ti, Ta, W, and Mo.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a structure having a substrate, a semiconductor channel layer over the substrate, an interfacial oxide layer over the semiconductor channel layer, and a high-k gate dielectric layer over the interfacial oxide layer, wherein the semiconductor channel layer includes germanium;
forming a metal nitride layer over the high-k gate dielectric layer;
performing a first treatment to the structure using a metal-containing gas;
after the performing of the first treatment, depositing a silicon layer over the metal nitride layer; and
after the depositing of the silicon layer, annealing the structure such that a metal intermixing layer is formed over the high-k gate dielectric layer, wherein the metal intermixing layer includes a metal oxide having metal species from the high-k gate dielectric layer and additional metal species from the metal-containing gas.

2. The method of claim 1, wherein the semiconductor channel layer includes silicon germanium or germanium tin.

3. The method of claim 2, wherein the semiconductor channel layer includes silicon germanium and the metal-containing gas includes $MoCl_4O$, $WF_6$, $TiCl_4$, or PDMAT.

4. The method of claim 2, wherein the semiconductor channel layer includes germanium tin and the metal-containing gas includes $MoCl_4O$ or $WF_6$.

5. The method of claim 1, wherein the metal nitride layer includes titanium nitride, tantalum nitride, or titanium silicon nitride.

6. The method of claim 1, wherein the metal nitride layer is formed after the performing of the first treatment and before the depositing of the silicon layer.

7. The method of claim 6, after the metal nitride layer is formed and before the depositing of the silicon layer, further comprising:
performing a second treatment to the structure using the metal-containing gas.

8. The method of claim 7, before the depositing of the silicon layer, further comprising:
forming a second metal nitride layer after the performing of the second treatment; and
performing a third treatment to the structure using the metal-containing gas after the second metal nitride layer is formed.

9. The method of claim 1, further comprising:
performing a second treatment to the structure using a silicon-containing gas immediately after the performing of the first treatment.

10. The method of claim 9, before the depositing of the silicon layer and after the performing of the second treatment, further comprising:
depositing a second silicon layer over the metal nitride layer.

11. The method of claim 10, before the depositing of the silicon layer and after the depositing of the second silicon layer, further comprising:
performing a third treatment to the structure using the metal-containing gas and the silicon-containing gas.

12. The method of claim 1, further comprising:
depositing a second silicon layer over the metal nitride layer before the performing of the first treatment.

13. The method of claim 12, after the performing of the first treatment and before the depositing of the silicon layer, further comprising:
depositing a third silicon layer over the second silicon layer; and
performing a second treatment to the structure using the metal-containing gas.

14. The method of claim 1, further comprising:
removing the silicon layer and the metal nitride layer and keeping at least a portion of the metal intermixing layer in the structure; and
forming a metal gate electrode over the high-k gate dielectric layer and the metal intermixing layer.

15. A method comprising:
providing a structure having a substrate, a semiconductor channel layer over the substrate, an interfacial oxide layer over the semiconductor channel layer, and a high-k gate dielectric layer over the interfacial oxide layer, wherein the semiconductor channel layer includes germanium;
forming a metal nitride layer over the high-k gate dielectric layer;
after the forming of the metal nitride layer, performing a first treatment to the structure using a metal-containing gas;
after the performing of the first treatment, depositing a passivation layer over the metal nitride layer, wherein the passivation layer includes silicon;
after the depositing of the passivation layer, annealing the structure such that a metal intermixing layer is formed over the high-k gate dielectric layer, wherein the metal intermixing layer includes a metal oxide having metal species from the high-k gate dielectric layer and additional metal species from the metal-containing gas;
removing the passivation layer and the metal nitride layer and keeping at least a portion of the metal intermixing layer in the structure; and
forming a metal gate electrode over the high-k gate dielectric layer and the metal intermixing layer.

16. The method of claim 15, wherein the metal nitride layer includes titanium nitride, tantalum nitride, or titanium silicon nitride, and the metal-containing gas includes $MoCl_4O$, $WF_6$, $TiCl_4$, or PDMAT.

17. The method of claim 15, before the depositing of the passivation layer, further comprising:
depositing a silicon layer over the metal nitride layer.

18. A method, including:
providing a structure having a semiconductor channel layer, an interfacial layer over the semiconductor channel layer, and a high-k gate dielectric layer over the interfacial layer, wherein the semiconductor channel layer includes germanium;
forming a metal nitride layer over the high-k gate dielectric layer;
depositing a first silicon layer over the metal nitride layer;
performing a treatment to the structure using a metal-containing gas;
forming a second silicon layer over the metal nitride layer;
performing an annealing process to form a metal intermixing layer over the high-k gate dielectric layer;
removing layers down to the metal intermixing layer; and
forming a metal gate electrode over the high-k gate dielectric layer and the metal intermixing layer.

19. The method of claim 18, wherein the metal intermixing layer includes a metal oxide having metal species from the high-k gate dielectric layer and additional metal species.

20. The method of claim 19, wherein the treatment is a first treatment, and
wherein the method further comprises performing a second treatment to the structure using the metal-containing gas before forming the second silicon layer.

* * * * *